United States Patent
Akita et al.

(10) Patent No.: US 7,318,865 B2
(45) Date of Patent: *Jan. 15, 2008

(54) CRYSTALLIZATION APPARATUS AND METHOD; MANUFACTURING METHOD OF ELECTRONIC DEVICE, ELECTRONIC DEVICE, AND OPTICAL MODULATION ELEMENT

(75) Inventors: Noritaka Akita, Yokohama (JP); Yoshio Takami, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 343 days.

This patent is subject to a terminal disclaimer.

(21) Appl. No.: 11/006,732

(22) Filed: Dec. 8, 2004

(65) Prior Publication Data
US 2005/0153552 A1   Jul. 14, 2005

(30) Foreign Application Priority Data
Dec. 25, 2003   (JP) ............................. 2003-428592
Sep. 3, 2004    (JP) ............................. 2004-256996

(51) Int. Cl.
*C30B 25/12*   (2006.01)
(52) U.S. Cl. ....................... 117/200; 117/202; 117/900; 438/795

(58) Field of Classification Search ................ 117/200, 117/202, 900; 438/795
See application file for complete search history.

(56) References Cited

U.S. PATENT DOCUMENTS
2002/0079276 A1   6/2002   Miyake

FOREIGN PATENT DOCUMENTS
| JP | 6-163349 | 6/1994 |
| JP | 2000-505241 | 4/2000 |
| WO | WO 03/092061 A1 | 11/2003 |

OTHER PUBLICATIONS

Masakiyo Matsumura, "Preparation of Ultra-Large Grain Silicon Thin-Films by Excimer-Laser", Journal of the Suface Science Society of Japan, vol. 21, No. 5, 2000, pp. 278-287.

*Primary Examiner*—Felisa Hiteshew
(74) *Attorney, Agent, or Firm*—Oblon, Spivak, McClelland, Maier & Neustadt, P.C.

(57) ABSTRACT

A manufacturing method of an electronic device includes positioning a processed substrate with respect to a substrate stage of a crystallization apparatus and supporting it with at least one positioning mark previously provided on the processed substrate being used as a references, applying a modulated light beam to a predetermined area of the processed substrate supported by the substrate stage and crystallizing the area, and forming at least one circuit element in the crystallized area of the processed substrate subjected to positioning with the positioning mark being used as a reference.

14 Claims, 16 Drawing Sheets

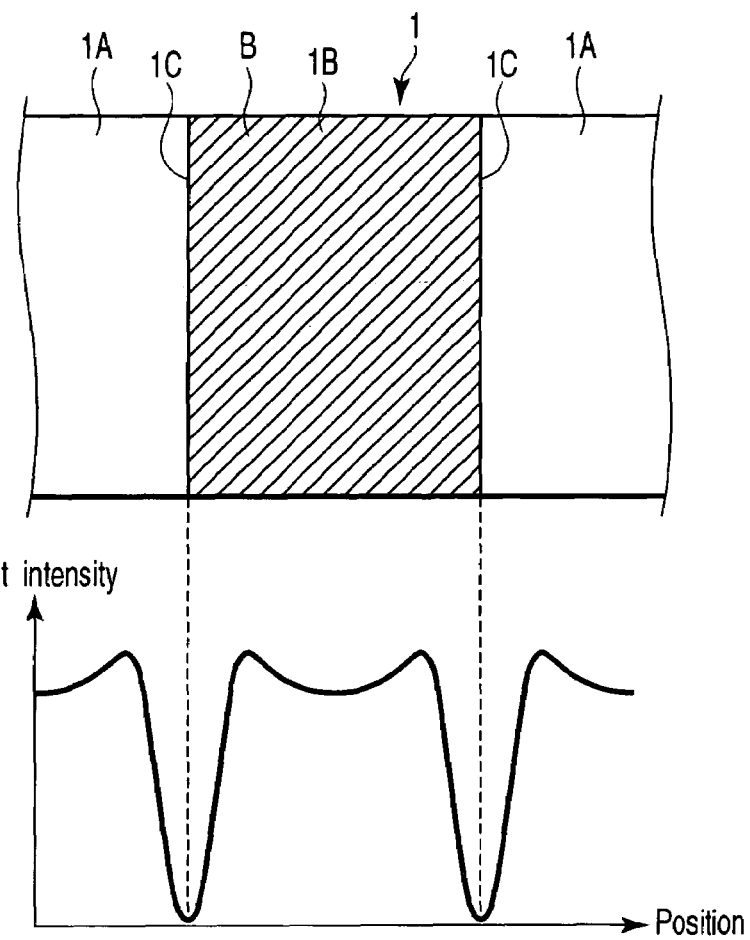
FIG. 13A
FIG. 13B
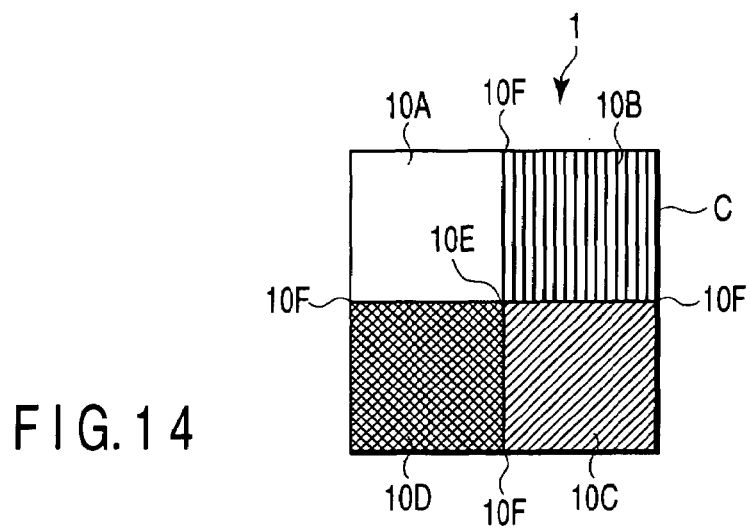
FIG. 14

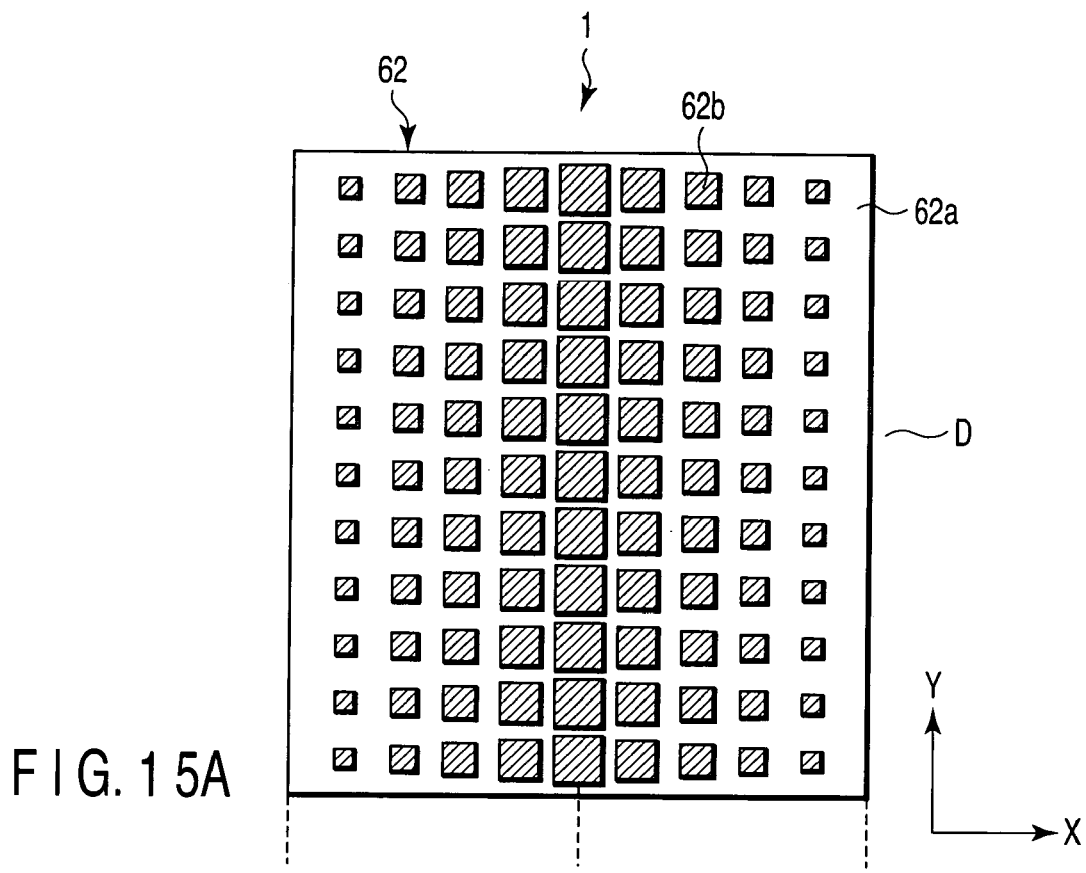
FIG. 15A
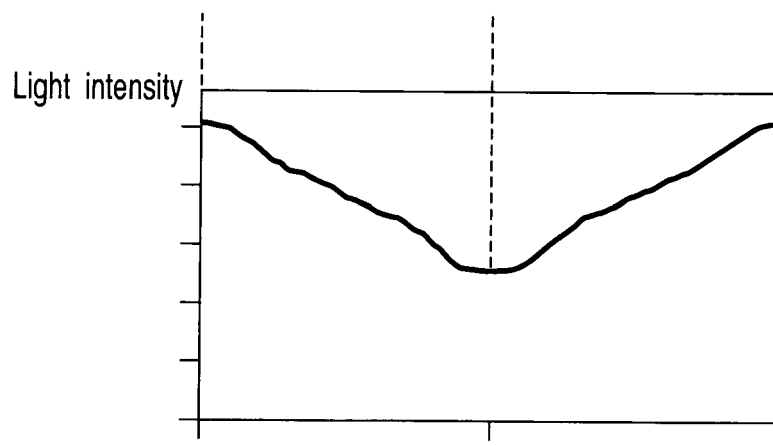
FIG. 15B　Light intensity distribution

CRYSTALLIZATION APPARATUS AND METHOD; MANUFACTURING METHOD OF ELECTRONIC DEVICE, ELECTRONIC DEVICE, AND OPTICAL MODULATION ELEMENT

CROSS-REFERENCE TO RELATED APPLICATIONS

This application is based upon and claims the benefit of priority from prior Japanese Patent Applications No. 2003-428592, filed Dec. 25, 2003; and No. 2004-256996, filed Sep. 3, 2004, the entire contents of both of which are incorporated herein by reference.

BACKGROUND OF THE INVENTION

1. Field of the Invention

The present invention relates to a crystallization apparatus and method which fuse and crystallize a crystallization target area such as a polycrystal semiconductor film of a processed substrate by using light rays, a manufacturing method of an electronic device and an electronic device.

2. Description of the Related Art

For example, as a method for crystallizing an amorphous semiconductor, e.g., an amorphous silicon thin film formed on a glass substrate of a liquid crystal or electroluminescent (EL) display apparatus without giving heat damages to this glass substrate, an excimer laser crystallization method has been developed. This technique homogenizes an intensity of a light irradiation cross section of excimer light by using a homogenizing optical system, forms the excimer light into a rectangular shape (e.g., a cross-sectional shape is 150 mm×200 μm) through a metallic mask having an elongated rectangular opening, and projects the obtained excimer light. Scanning is effected by linearly relatively moving in one direction a surface of an amorphous silicon thin film previously deposited on a glass substrate by using the projected laser light, and the laser light is intermittently applied in a short axis direction at intervals of 10 μm.

As a result, the amorphous silicon thin film which absorbed this applied laser light is fused, its temperature is lowered when the incidence of the laser light is interrupted, and the amorphous silicon is converted into polycrystal silicon. In this technique, even if a substrate formed of a material such as general glass or plastic which has a weakness for intense heat is used, heat damage is not generated in the substrate. That is because the excimer laser is a pulse laser which is approximately 20 nm, and a crystallization process period is completed in approximately 50 to 100 ns. A crystal particle size of polycrystal crystallized in this manner is dependent on a laser energy density, and the particle or grain size is approximately 0.1 to 1 μm, thereby forming a polycrystal silicon thin film formed of crystal grains having such a particle size.

As a technique developed from the excimer laser annealing, there is known a technique called a sequential lateral solidification (SLS) mode (see, e.g., Journal of the Surface Science Society of Japan, Vol. 21, No. 5, pp. 278-287, 2000). According to this technique, excimer laser light whose light intensity is homogenized by a homogenizing optical system is passed through a mask to which a metal narrow slit which is approximately 2 microns is provided, thereby forming its cross section into a rectangular shape.

When a fluence (energy density) of the laser light which has passed through the narrow slit is set in such a manner that the amorphous silicon thin film is fully fused in a thickness direction, lateral growth occurs from an outer area of the narrow slit toward the inner side, thereby forming crystallized silicon. Then, when a sample is moved in one direction by two microns and laser light is applied thereto, the fused silicon grows in the lateral direction with one end portion of the crystallized silicon formed by the laser application being used as a seed crystal. Repeating the laser application and the sample movement process can form the polycrystal silicon thin film with a large particle size.

As a method obtained by further developing the excimer laser crystallization method, there is known a phase modulation excimer laser crystallization method (e.g., PCT National Publication No. 2000-505241). Characteristics of this method lie in that excimer laser light is modulated to have a laser light intensity distribution having an inverse peak pattern in which a minimal light intensity portion corresponds to a phase shift portion by transmitting the excimer laser light through an optical component called a phase shifter (e.g., one having a linear phase shift portion formed between two types of areas whose phases are shifted by 180 degrees by performing step machining with respect to a quarts plate and forming these two types of areas). Pulse application is carried out with respect to, e.g., an amorphous silicon thin film formed on a substrate by using the thus modulated laser light, and an irradiation area is crystallized in accordance with each irradiation.

As different from the excimer laser crystallization method and the SLS mode, this method does not use a homogenized light intensity distribution, and the same area does not have to be irradiated with the laser light for many times. In this method, a temperature distribution which is inclined in accordance with an inverse pattern is generated in the amorphous silicon thin film irradiated with the laser light due to the modulated light intensity distribution having the inverse pattern, and a crystal nucleus, i.e., a crystal seed is formed at a position where the energy is small. Further, a growth distance is increased due to lateral growth based on this crystal nucleus, thereby obtaining a crystal grain with a large particle size. A crystal grain with a large particle size can, therefore, be formed while controlling a position of the crystal grain.

In regard to the excimer laser crystallization method explained first, a crystal grain size is approximately 1 to 2 microns at the maximum level and approximately 0.05 micron at the minimum level, and a crystal particle size is intensely dependent on a fluence of the laser light. Therefore, the crystal particle size becomes uneven unless a laser light intensity is homogenized. As a result, irregularities are generated in transistor characteristics (a threshold voltage, a subshred coefficient, a mobility). In general, a channel area of an MOS transistor which requires a length of not less than 4 μm cannot be formed in only one crystal grain based on a crystal particle size which is approximately 1 to 2 microns at the maximum level, and it must be formed across a plurality of crystal grains. Therefore, there is a problem that a plurality of crystal grain boundaries are formed in each channel area and differences in crystal grain boundary number results in differences in characteristics, thereby forming respective transistors. Furthermore, when electrons (holes) move across a crystal grain boundary, the crystal grain boundary becomes an obstacle, which affects the mobility.

In regard to the SLS mode described after the excimer laser crystallization method, since nearly a half of the laser light is shielded by using a metallic mask, the laser energy cannot be effectively utilized. Moreover, since crystallization is a carried out with a crystal particle size of 1 μm or below, there is a problem that irregularities are generated in transistor characteristics (a threshold voltage, a subshred coefficient, a mobility) like the first prior art.

In regard to the phase modulation excimer laser crystallization technique described at-last, this is a technique which can perform extensive crystallization with a crystal particle size of, e.g., approximately 6 µm or above, and is an excellent crystallization technique which can manufacture a channel area of a transistor in one crystal grain boundary. The present inventors and others has developed an industrialization technology of a high-performance display apparatus utilizing this crystallization technique. In this process, there is a demand to accurately manufacture a transistor in a crystallized area in a unit of µm so that at least one channel area having a length of not less than 4 µm can be positioned in each crystal grain. Even if a crystal grain with a large particle size can be formed, a channel area cannot be formed in a crystal grain in an exposure step in particular when the positioning accuracy of the channel area of each transistor and each crystal grain cannot be obtained. Each thin-film transistor having such a channel area cannot obtain desired even characteristics, e.g., a high electron mobility. For example, if a channel area of each pixel switching transistor of a display apparatus is formed by using the above-described technique, a response speed varies depending on each position, thereby resulting in display unevenness.

BRIEF SUMMARY OF THE INVENTION

In view of the above-described problems, it is an object of the present invention to provide a crystallization method and a crystallization apparatus which can perform crystallization so that a predetermined area of a processed substrate becomes a large crystal grain with the excellent position accuracy by utilizing a crystallization technique of light rays such as optically modulated laser light, a manufacturing method of an electronic device which can accurately form a necessary area of an electron device such as a transistor, e.g., a channel area in such a crystal grain, and an electronic device.

In an aspect of the present invention there is provided a method for manufacturing an electronic device in an area of a processed substrate crystallized by a crystallization apparatus, the crystallization apparatus comprising:

an illumination system which projects a light beam which fuses the processed substrate;

an optical modulation element which modulates the light beam into a light beam having at least one light intensity distribution changed from a minimal light intensity to a maximal light intensity; and a substrate stage which is provided at a position which the light beam transmitted through the optical modulation element strikes, and supports the processed substrate, the manufacturing method comprising:

positioning the processed substrate with respect to the substrate stage of the crystallization apparatus and supporting it with at least one positioning mark previously provided on the processed substrate being used as a references;

applying the modulated light beam to a predetermined area of the processed substrate supported by the substrate stage and crystallizing the area; and forming at least one circuit element in the crystallized area of the processed substrate subjected to positioning with the positioning mark being used as a reference.

In the other aspect of the present invention there is provided a crystallization method comprising:

sequentially projecting a pulse laser beam toward a processed substrate;

light-intensity-modulating the laser beam into a laser beam having a light intensity distribution with a predetermined pattern, illuminating an area of the processed substrate, and crystallizing the area;

detecting a position of the optical modulation element before and/or during the light-intensity-modulation; and controlling the position of the optical modulation element based on a detection result of detection of the third step.

According to such a technique, a desired area can be crystallized into a crystallization area comprising a crystal grain having a large particle size with the excellent position accuracy. Additionally, it is possible to obtain an electronic device in which a predetermined area such as a channel area is accurately formed in the thus formed crystal grain.

Further, it is possible to obtain a crystallization apparatus and method which can form a crystallization area with a relative position accuracy which is precise with respect to a reference adjustment mark by which positioning can be effected in an apparatus at a next step.

When an optical modulation element should is replaced or crystallization processing should be carried out by using another pattern in a mask, light having a light intensity distribution with a desired pattern can be applied to a predetermined area of a processed substrate with the excellent position accuracy. As a result, a crystallization area subjected to a position control can be formed or the processed substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 13A is a view showing Embodiment 1 of a phase shift pattern, and FIG. 13B is a view showing a light intensity distribution modulated by the phase shifter depicted in FIG. 13A;

FIG. 14 is a view showing Embodiment 2 of the phase shift pattern;

FIG. 15A is a view showing Embodiment 3 of the phase shift pattern, and FIG. 15B is a view showing a light intensity distribution modulated by the phase shifter depicted in FIG. 15A;

DETAILED DESCRIPTION OF THE INVENTION

A principle of a crystallization apparatus and method according to an embodiment of the present invention will now be roughly described with reference to FIGS. 1 and 2.

Figure 1:
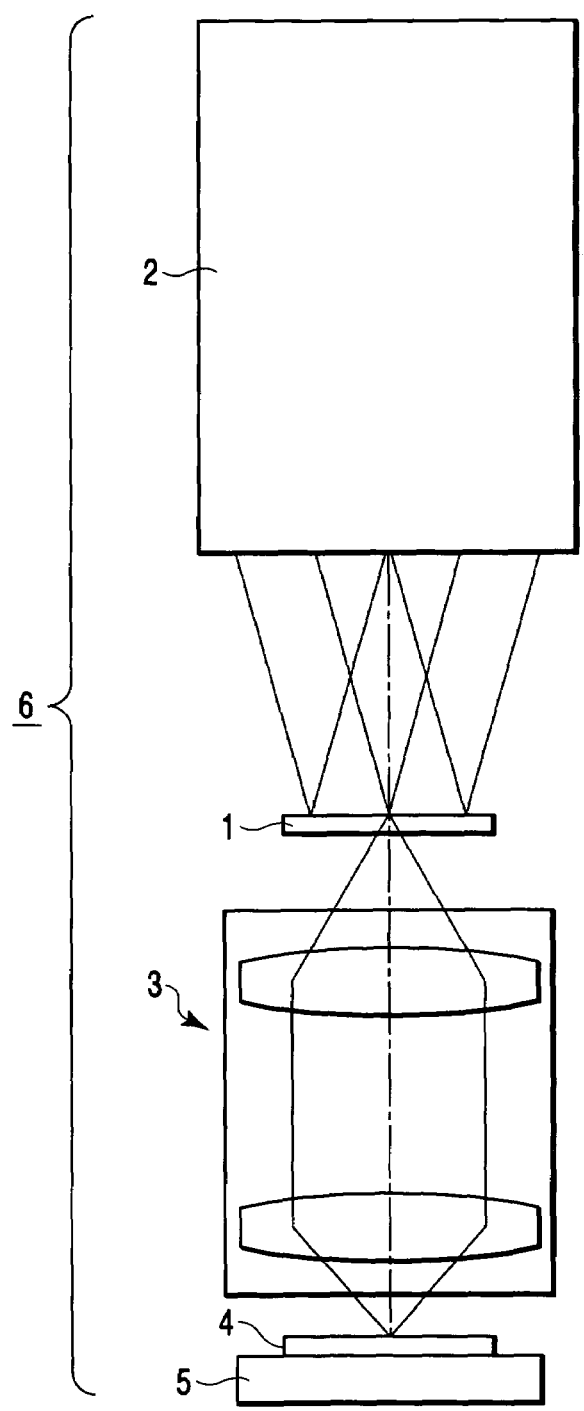
FIG. 1 is a schematic view of an entire apparatus illustrating a principle of crystallization of a crystallization apparatus according to an embodiment of the present invention.
Figure 2:
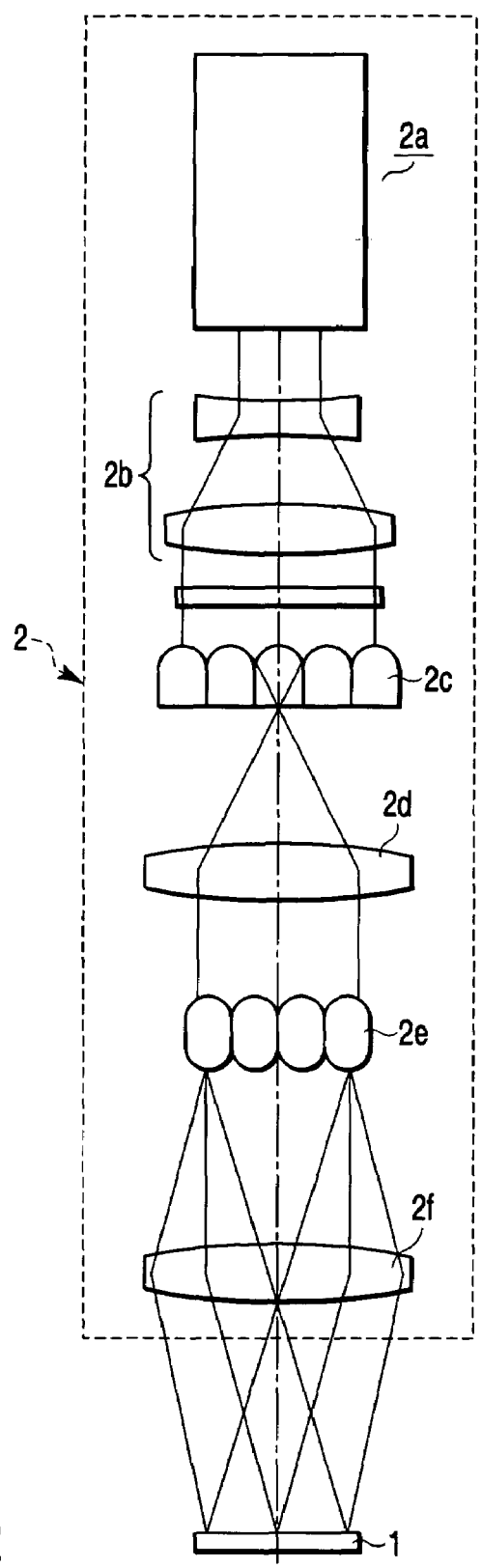
FIG. 2 is a schematic view illustrating an illumination system of the apparatus depicted in FIG. 1.

As shown in FIGS. 1 and 2, a crystallization apparatus according to this embodiment comprises an illumination system 2 which illuminates an optical modulation element, e.g., a phase shifter 1 having a phase shift portion. As shown in FIG. 2, this illumination system 2 comprises, e.g., an XeCl excimer laser light source 2a which projects a laser beam having a wavelength of 308 nm (or a KrF excimer laser light source which supplies laser light having a wavelength of 248 nm), a beam expander 2b, a first fly-eye lens 2c, a first condenser optical system 2d, a second fly-eye lens 2e, and a second condenser optical system 2f which are sequentially arranged on a projection side of this light source.

The laser beam having a rectangular cross section projected like pulses from the light source 2a is expanded to a predetermined size through the beam expander 2b, and then enters the first fly-eye lens 2c. Accordingly, a plurality of small light sources are formed on a rear focal plane of the first fly-eye lens 2c, and an incident surface of the second fly-eye lens 2e is illuminated with light rays from these small light sources through the first condenser optical system 2d in the overlapping manner. As a result, more small light sources are formed on a rear focal plane of the second fly-eye lens 2e than those on the rear focal plane of the first fly-eye lens 2c, and the laser beam with an even intensity is projected. An optical modulation element such as a phase shifter 1 is illuminated with the light rays from these small light sources through the second condenser optical system 2f in the overlapping manner.

The first fly-eye lens 2c and the first condenser optical system 2d constitute a first homogenizer, and an intensity concerning an incident angle on the phase shifter 1 is homogenized by this first homogenizer. Further, the second fly-eye lens 2e and the second condenser optical system 2f constitute the second homogenizer, and an intensity concerning an in-plane position on the phase shifter is homogenized by this second homogenizer. In this manner, the illumination system 2 applies the light beam having a substantially even light intensity distribution to the phase shifter 1.

The optical modulation element is an optical component which modulates incident a light beam into a light beam having a light intensity distribution changed from a minimal light intensity to a maximal light intensity, and the phase shifter 1 is a most appropriate example. The laser beam phase-modulated by the phase shifter 1 is, as shown in FIG. 1, applied to a processed substrate 4 through an image forming optical system 3 including an image forming lens. In this example, the phase shifter 1 and the processed substrate 4 are arranged at an optically conjugate position of the image forming optical system 3. The phase shifter 1 has steps on a transparent medium such as a quartz plate, causes diffraction and interference of the laser rays at a boundary of the steps, and provides a periodic spatial distribution to a laser light intensity. It is desirable for the phase shifter 1 to give a phase difference of, e.g., 180°. Assuming that λ is a wavelength of the laser light, the phase difference of 180° is formed by setting a film thickness t of a transparent medium having a refractive index n as $t=\lambda/2(n-1)$. Assuming that a refractive index of a quartz plate is 1.46 and a wavelength of the XeCl excimer laser light is 308 nm, the steps of 334.8 nm is required in order to provide a phase difference of 180°.

Figure 3:
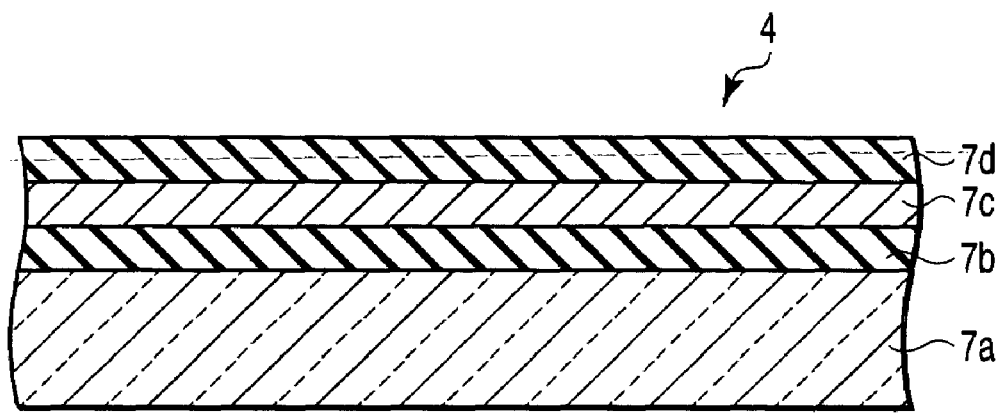
FIG. 3 is a cross-sectional view showing a part of a liquid crystal display glass substrate as a processed substrate.

As shown in FIG. 3, the processed substrate 4 is obtained by sequentially forming on a substrate, e.g., a glass substrate 7 for a liquid crystal display an underlying thin film, e.g., a silicon oxide thin film 7b, an amorphous semiconductor, e.g., an amorphous silicon thin film 7c, and a cap film, e.g., a silicon oxide thin film (cap film) 7d by a chemical vapor deposition method. The processed substrate 4 is not restricted thereto, and it may be, e.g., a semiconductor wafer such as silicon. The processed substrate 4 is held at a predetermined position on a substrate stage 5 by a vacuum chuck, an electrostatic chuck or the like. This substrate stage 5 may be moves in directions of X, Y, Z and θ by a later-described drive mechanism. A mechanism which can form a crystallization area position-controlled to the processed substrate 4 is provided to this substrate stage 5 and the phase shifter 1.

In this example, it is preferable for the laser beam which strikes on the processed substrate 4 to have a rectangular cross section, and a rectangular cross section which is long in the Y direction rather than a square cross section (e.g., one side is 2 μm) is preferable for reducing the number of times of return irradiation on the substrate and increasing a throughput. In this case, it is necessary to set a length of one side Y≧a length of the other side X (where X is a continuous feed direction). That is, one side of the rectangular cross section of the laser beam corresponding to the X direction (direction in which the processed substrate 4 is moved by the drive mechanism for crystallization) is preferably set in such a manner it becomes shorter than a value obtained by dividing a maximum average speed of movement of the substrate stage 5 in the X direction in a later-described range in which positioning is possible by a cyclic frequency of the laser beam. In this manner, a projection type crystallization apparatus 6 is constituted. The optical system which is different from that described in Journal of the Surface Science Society of Japan, Vol. 21, No. 5, pp. 278-287, 2000 is the projection type crystallization apparatus 6, the illumination optical system is the homogenizer optical system, and a crystallization area which is position-controlled is provided to the processed substrate.

In such a crystallization apparatus 6, the laser light is phase-modulated into laser light having a light intensity distribution with an inverse peak pattern by the phase shifter 1, and the amorphous silicon thin film 7c is irradiated with this laser light. As a result, an area irradiated with the laser light on the amorphous silicon thin film 7c is fused. A temperature of the fused area is lowered after incidence of the phase-modulated laser beam is interrupted. In this temperature lowering step, a temperature of a high-temperature portion tends to be relatively rapidly lowered, but the temperature is slowly reduced by a thermal storage effect of the cap film.

Figure 4:
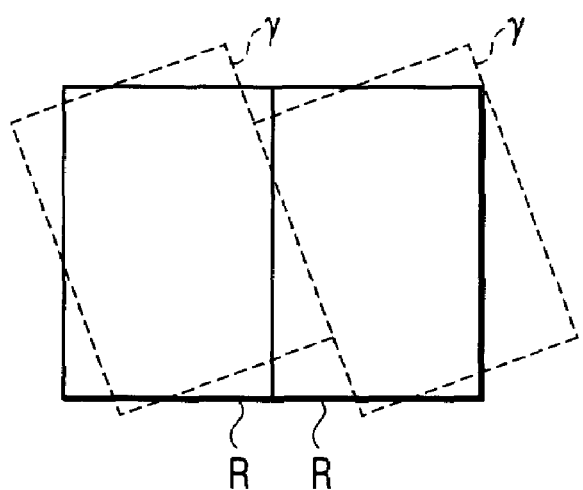
FIG. 4 is a view illustrating especially a displacement of the crystallization apparatus according to the embodiment of the present invention.

By this slow reduction in temperature, solidification moves over a great distance in the lateral direction, and growth of a crystal with a large particle size is enabled. In regard to a start position of this solidification, a crystal nucleus is formed at a position of the amorphous silicon thin film 7 corresponding to a minimal light intensity position of the inverse peak pattern, and crystallization occurs from this crystal nucleus in the lateral direction, thereby forming a large crystal grain. When operations in the step of operating a crystallization position of the above-described amorphous silicon thin film, the step of applying the laser beam having the light intensity distribution with the inverse peak pattern or patterns, the step of lowering a temperature and others are carried out by sequentially moving the substrate stage 5 in the X direction, the amorphous silicon thin film 7c provided to the processed substrate 4 is thereby crystallized into polycrystal silicon. In the prior art, however, an area R which is desired to be crystallized and an area r which is actually crystallized in the processed substrate would be shifted from each other in some cases as shown in FIG. 4, and occurrence of such shifting may form a channel area of a transistor or the like in an uncrystallized area. In FIG. 4, the areas of the solid line denoted by R are areas to be crystallized, and the areas of the broken line designated by r are actually crystallized areas. In this case, when a channel is formed outside the area indicated by the broken line in the area indicated by the solid line, a transistor having desired characteristics cannot be obtained.

A crystallization apparatus and a crystallization method according to one embodiment of the present invention based on the crystallization principle will now be described with reference to FIGS. 5 to 11. Like reference numerals denote parts which are substantially the same as those in FIGS. 1 to 4, and the detailed explanation thereof will be eliminated in order to avoid repetition.

A description will be given as to a first position detection system (means) which detects an absolute position of an optical modulation element, and a second position detection system (means) which detects an absolute position of a processed substrate. Here, the "absolute position" of the substrate and the "absolute position" of the optical modulation element mean absolute positions of the processed substrate and the optical modulation system seen from the position detection systems fixed to the crystallization apparatus.

Figure 6:
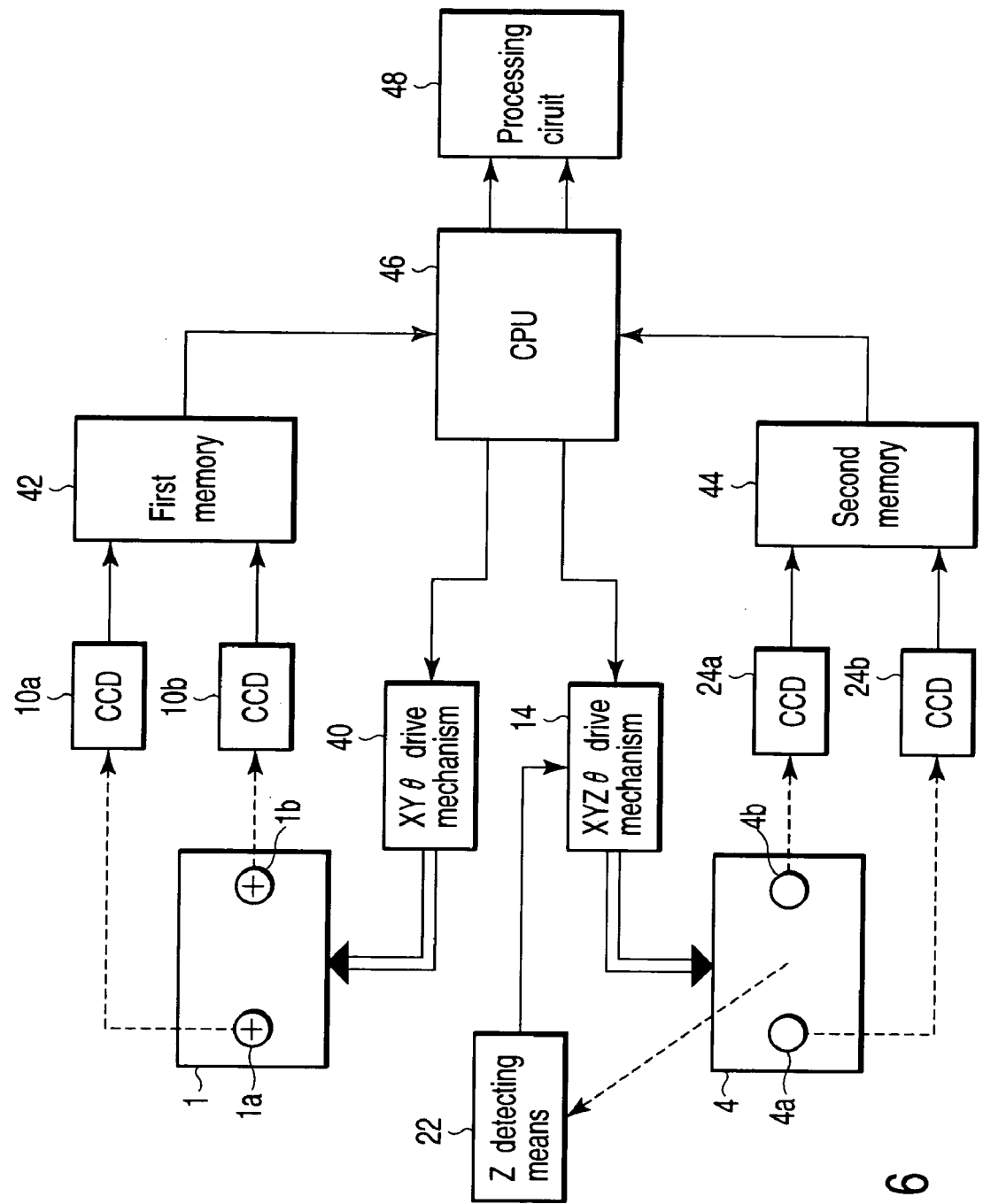
FIG. 6 is a block diagram of the crystallization apparatus mentioned above.

As an illumination system 2 which is a light source, there is used an XeCl excimer laser light source which projects a laser beam having an energy intensity of, e.g., 280 mJ and a wavelength of, e.g., 308 nm at a predetermined frequency, e.g., a cyclic frequency of 100 Hz. That is, the light source projects the light beam having a light intensity with which, e.g., an amorphous silicon thin film 7c of a processed substrate 4 is fused, e.g., pulse laser beam at a cyclic frequency of 100 Hz. The pulse light beam projected from this light source obtains a substantially even light intensity distribution by first and second homogenizers, and enters a phase shifter 1. This phase shifter 1 is an optical modulation element which phase-modulates the homogenized incident laser beam and converts it into a laser light beam having a light intensity distribution which is used to grow a crystal grain with a large particle size. The phase shifter 1 has, e.g., a rectangular shape and, as described above, a phase shift portion (not shown) is formed thereto. Besides, as shown in FIG. 6, a pair of positioning marks 1a and 1b are formed in the vicinity of both ends on the laser light incident surface side. Each of the positioning marks 1a and 1b can be obtained by forming a concave or convex crisscross pattern in case of, e.g., a quartz glass phase shifter 1.

Figure 5:
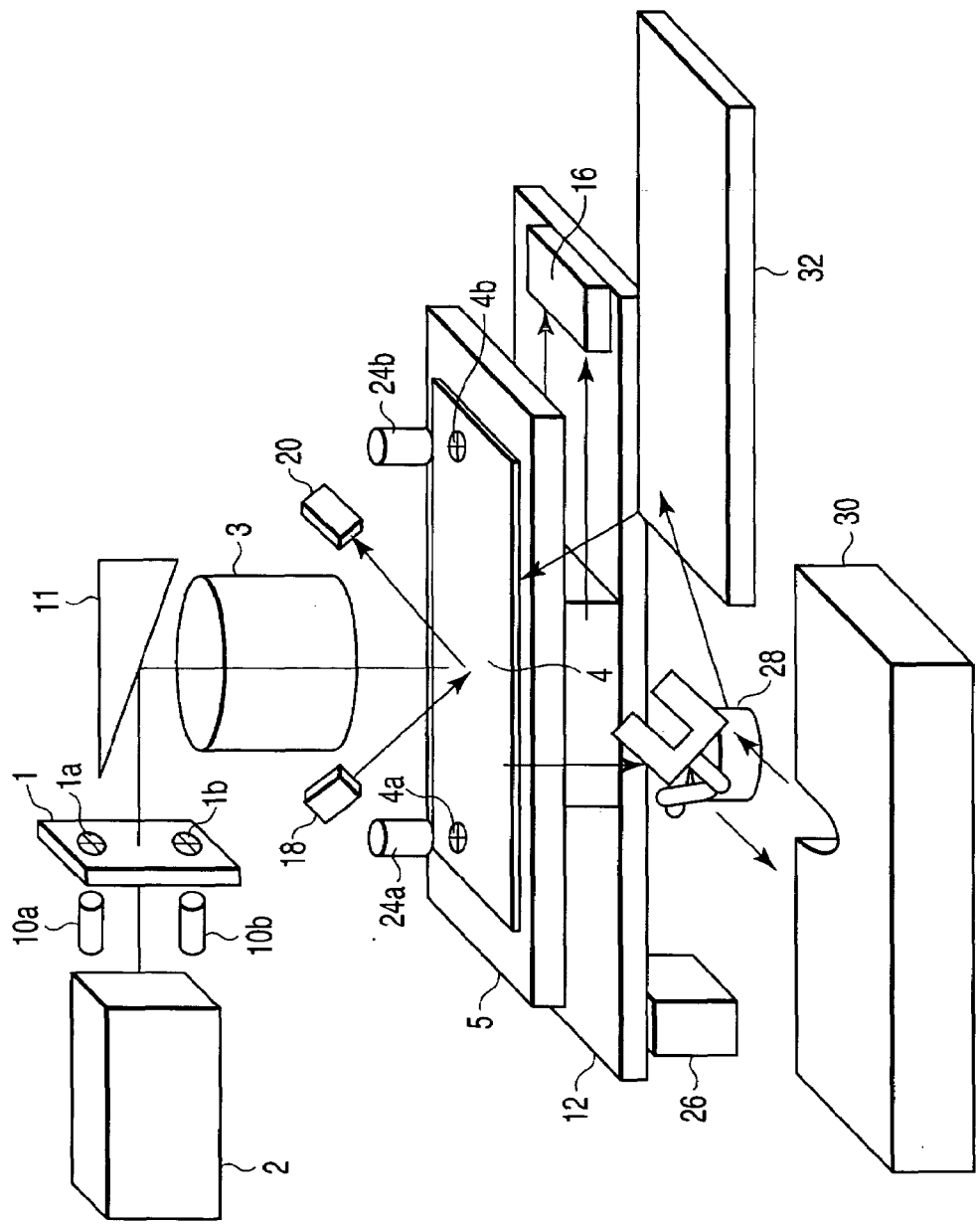
FIG. 5 is a perspective view schematically showing the crystallization apparatus according to the embodiment of the present invention.

Furthermore, as shown in FIG. 5, detection of the positioning marks 1a and 1b is achieved when a pair of mark detectors, e.g., CCD cameras 10a and 10b provided in association with these positioning marks 1a and 1b detect (image) the positioning marks 1a and 1b. A relationship between the positioning marks 1a and 1b and the CCD cameras 10a and 10b will be described later in detail.

A reflection mirror 11 (which is eliminated in FIG. 1) which deflects the incident laser beam at 180 degrees and allows it to enter an image forming optical system 3 is provided on the projection side of the phase shifter 1. This image forming optical system 3 forms an image of the phase shifter 1 on the processed substrate 4, and it is a double-sided telecentric image forming optical system or one-sided telecentric image forming optical system (telecentric optical system on the processed substrate side alone) of ⅕-power having a numerical aperture NA of, e.g., 0.12 and a resolution of, e.g., 2 μm. The image forming optical system 3 is subjected to distortion correction and chromatic aberration correction according to needs. Of course, such an image forming optical system 3 is just an example, and any type of the image forming optical system can be adopted as long as it forms an image of the phase shifter 1 on a predetermined image forming surface of the processed substrate 4. For example, the reduction ratio is not restricted to ⅕, and a magnifying power or an equal power may be used.

The processed substrate 4 is arranged in such manner that an upper surface of the processed substrate 4 (lower surface of the amorphous silicon thin film formed on this substrate) is placed at a defocus position of a focus position of this image forming optical system 3 on the projection side. When this processed substrate 4 comprises, e.g., a glass substrate 7a of a rectangular liquid crystal display apparatus, an amorphous silicon thin film 7c and others as shown in FIG.

Figure 10:
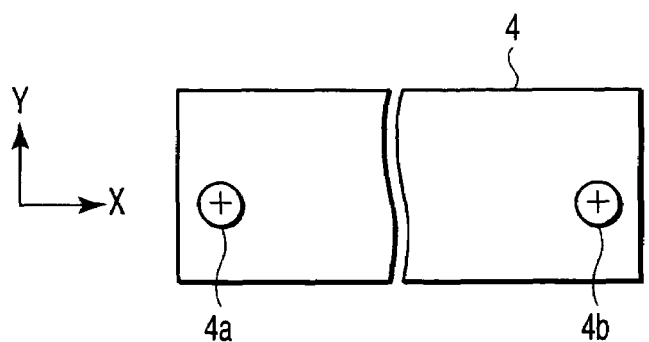
FIG. 10 is a view illustrating a positional relationship of the processed substrate.

3, a pair of positioning marks 4a and 4b are formed in the vicinity of both ends on the upper surface of the glass substrate 7a as shown in FIG. 10.

The processed substrate 4 is fixedly supported on a substrate stage 5. This substrate stage 5 is provided on a support table 12 so that it can move in X, Y, Z and θ directions in order to horizontally support the processed substrate 4 and move the processed substrate 4 in the same directions. This substrate stage 5 is moved by, e.g., an XYZθ drive mechanism 14 (which is eliminated in FIG. 5 and shown in the form of a block in FIG. 6) comprising a mechanism which may be a combination of a ball screw and a motor. Moreover, a control over movement of the substrate stage 5 by the XYZθ drive mechanism 14 is carried out by an X axis position sensor 16 and a Y axis position sensor (not shown) which are respectively arranged outside the X direction and the Y direction of the substrate stage 5 in regard to the XYθ direction. The sensors are constituted by combining an interferometer having a sensor resolution of 0.027 μm with a laser oscillator. This XYZθ drive mechanism 14 is set to move the substrate stage 5 in the X direction and the Y direction with a positioning accuracy which is not more than 2 μm. Additionally, when continuously moving the substrate stage 5 in the X direction or the Y direction while applying the laser beam to the processed substrate 4 in a fixed cycle, it is preferable for this XYZθ drive mechanism 14 to have less irregularities in a moving speed. As to the irregularities, those with which the substrate stage 5, i.e., the processed substrate 4 can be moved with positional unevenness which is, e.g., not more than 2 μm are preferable.

Movement of the substrate stage 5 in the Z direction is controlled by a substrate height detection mechanism (Z detecting means) 22 constituted by combining a light source 18 which obliquely projects a laser beam onto the upper surface of the processed substrate 4 with a light sensor 20 which receives reflected laser beam from the processed substrate 4. In this case, as the XYZθ drive mechanism 14, one which can move the substrate stage 5 in the Z direction with a poisoning accuracy which is not more than 10 μm is preferable. By a combined operation of such a detection mechanism 22 and the XYZθ drive mechanism 14, a gap between an image forming lens of the image forming optical system 3 and the upper surface of the processed substrate 4 can be always kept constant during crystallization processing.

A pair of mark detectors, e.g., CCD cameras 24a and 24b are provided in association with the positioning marks 4a and 4b of the processed substrate 4 in order to detect these positioning marks 4a and 4b. The support table 12 is supported by an active vibration removal mechanism 26, and thus external vibrations are prevented from being transmitted to the support substrate 12, i.e., the processed substrate 4. Incidentally, as the external vibrations, there are vibrations from another adjacent apparatus.

It is to be noted that reference numeral 28 denotes a carrier robot which carries the processed substrate 4 between a load lock chamber 30, a prealignment stage 32 and the substrate stage 5 as indicated by arrows in FIG. 5. The carrier robot 28 automatically carries the processed substrate 4 based on a program previously stored by a non-illustrated computer. The load lock chamber 30 is a storage mechanism which automatically carries in/out each of the processed substrates 4 before and after processing. The prealignment stage 32 is a stage which performs preliminary positioning of the processed substrate 4 which is yet to be carried to the substrate stage 5. This preliminary positioning detects an edge of an orientation flat of the rounded processed substrate 4 such as a semiconductor wafer, and performs position adjustment for positioning it at a previously stored standard position.

Figure 7A:
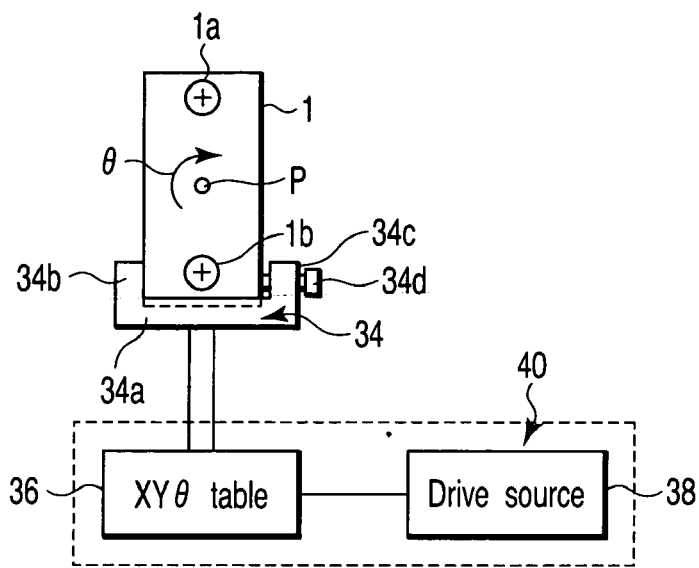
FIG. 7A is a view illustrating a phase shifter support mechanism.

As shown in FIG. 7A, the phase shifter 1 is detachably supported by a support mechanism 34. This support mechanism 34 is configured to hold and support the phase shifter 1 in such a manner that the phase shifter 1 can be readily replaced with another phase shifter 1 according to needs, for example. In this example, the support mechanism 34 comprises a base portion 34a provided with a groove into which a lower end of the phase shifter 1 is inserted, a pair of lateral support portions 34b and 34c which protrude upward from both ends of the base portion 34a, and a fixing screw 34d which pierces one support portion 34c. In such a support mechanism 34, the phase shifter 1 can be fixed by inserting the lower end portion of the phase shifter 1 into the groove in the base portion 34a and holding it between the fixing screw 34d and the other support portion 34b by fastening of the fixing screw 34d.

Figure 8:
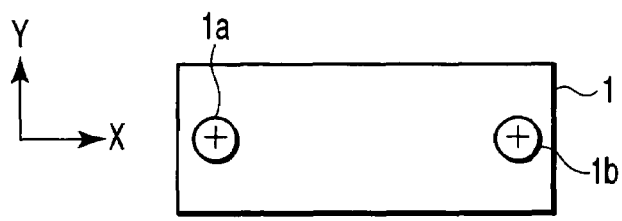
FIG. 8 is a view illustrating a positional relationship of the phase shifter depicted in FIG. 6.

This support mechanism 34 is supported by an XYθ table 36 in such a manner that it can move in the same direction as this table 36. This XYθ table 36 can be controlled and moved in the XYθ direction by a drive source 38 such as a motor. This XYθ table 36 and the drive source 38 constitute an XYθ drive mechanism 40. Here, as shown in FIG. 8, the X and Y directions are directions which are parallel to a flat surface of the phase shifter 1 and orthogonal to each other, i.e., directions orthogonal to an optical axis P of the laser beam, and the θ direction is a rotational direction about the optical axis P.

Figure 7B:
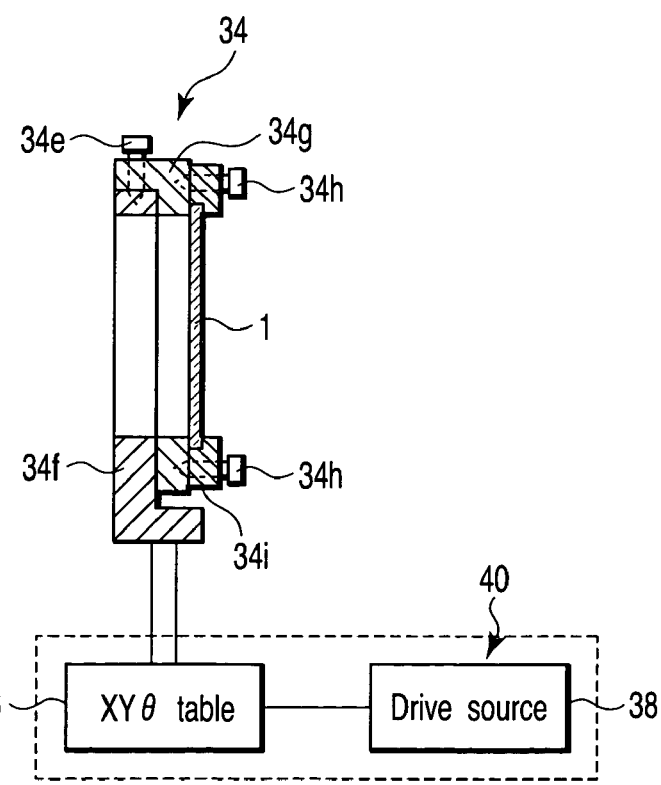
FIG. 7B is a view illustrating another example of the phase shifter support mechanism.

The above-mentioned support mechanism is just an example, and any type of the support mechanism can be adopted as long as it can fix the phase shifter 1 so that it does not move in use in the present invention, and, for example, a support mechanism 34 having a structure depicted in FIG. 7B may be used.

This support mechanism 34 has a fixing base 34f which is fixed to the XYθ table and has an L-shaped cross section, and an attachment substrate 34g which is detachably fixed to this fixing base 34f by a retaining screw 34e and has an inverted-L-shaped cross section. Further, a plurality of, e.g., three positioning pins (not shown) protrude on a phase shifter fixing surface (front surface on the side opposite to the side on which the fixing base 34f is positioned) of the attachment substrate 34g. These positioning pins are two vertical positioning pins which vertically protrude on the lower portion of the attachment substrate 34g with a predetermined gap therebetween in the horizontal direction (direction vertical to the page), and one horizontal positioning pin which protrudes at the middle portion in such a manner that it is distanced from the vertical positioning pins in the horizontal direction and the vertical direction. Furthermore, a retaining frame body 34i is provided on the front surface of the attachment substrate 34g by a fixing screw 34h in such a manner that it can move in the optical axis direction by its rotation. A rectangular through opening corresponding to the phase shift portion of the phase shifter 1 is formed at a central portion of each of the retaining frame body 34i, the fixing base 34f and the attachment substrate 34g, for example.

In the support mechanism 34 having such a structure, the phase shifter 1 is positioned on the front surface of the attachment substrate 34g by bringing the lower end surface and the end surface of one side into contact with the positioning pins then, the retaining frame body 34g is pressed against the phase shifter 1 by using the fixing screw 34h. As a result, the phase shifter 1 is positioned in the vertical direction and the horizontal direction by the positioning pins, and held between the attachment substrate 34g and the retaining frame body 34i in the positioned state. Then, the attachment substrate 34g is fixed to the fixing base 34f by using the retaining screw 34, thereby fixedly attaching the phase shifter 1 to the support mechanism 34.

A positioning system and method for the phase shifter 1 and the processed substrate 4 will now be described with reference to FIG. 6. FIG. 6 is a system configuration view for positioning the phase shifter 1 and the processed substrate 4. CCD cameras 10a and 10b for the phase shifter are provided at positions where the respective positioning marks 1a and 1b provided to the phase shifter 1 are imaged. This relationship is indicated by a dotted line. The CCD cameras 10a and 10b for the phase shifter are separated/independent from the XYθ table 36 and fixed to, e.g., a non-illustrated support mechanism of the crystallization apparatus 6.

Output sides of the CCD cameras 10a and 10b for the phase shifter are connected to a first memory 42 which is controlled by a CPU 46 of a computer which stores positional information from these cameras 10a and 10b.

CCD cameras 24a and 24b for the processed substrate are provided at positions where the respective positioning marks 4a and 4b provided to the processed substrate 4 are imaged. This relationship is indicated by a dotted line. The CCD cameras 24a and 24b for the processed substrate are independently separated from the substrate stage 5 and fixed to the crystallization apparatus 6. Output sides of the CCD cameras 24a and 24b for the processed substrate are connected to a second memory 44 which stores positional information from these cameras 24a and 24b. Output sides of both the memories 42 and 44 are connected to the CPU 46. A processing circuit 48 is connected in tern to this CPU 46. The processing circuit 48 converts the positional information from the memories 42 and 44 into appropriate information and processes it. The CPU 46 drives in a controlled manner an XYθ drive mechanism 40 for the phase shifter and an XYZθ drive mechanism 14 for the substrate stage based on the information, e.g., a previously stored program from the processing circuit 48.

A positioning control over the phase shifter 1 and the processed substrate 4 in the crystallization apparatus having the above-mentioned structure will now be described.

Figure 9:
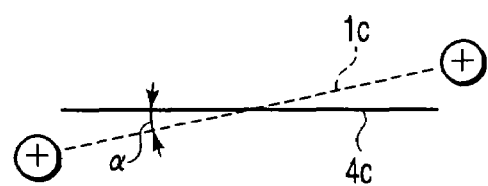
FIG. 9 is a view illustrating a displacement between the phase shifter and the processed substrate.

As described above, the positioning marks 1a and 1b are provided at or near both end portions of the phase shifter 1. Each of the positioning marks 1a and 1b comprises, e.g., a crisscross mark formed on the phase shifter 1 by an appropriate method, and the CCD cameras 10a and 10b image these marks 1a and 1b as positional information of the phase shifter 1. This positional information is sequentially stored in the first memory 42, read when necessary, and output to the processing circuit 48. The processing circuit 48 calculates such linear positional information as indicated by a broken line 1c in FIG. 9 based on imaging information of the both positioning marks 1a and 1b. FIG. 9 shows an example in which the linear positional information 1c is displaced at an angle +α in the θ direction from previously stored reference linear information as standard information indicated by a solid line 4c. The CPU 46 controls the XYθ drive mechanism 40 in such a manner that the phase shifter 1 is pivoted in the θ direction by an amount corresponding to this displacement angle −α. As a result, the phase shifter 1 is set to a preset flat surface state of the optical system.

Although the above example has described about automatic positional correction when the phase shifter 1 is displaced in the θ direction, the displacement in the XY direction can likewise be automatically corrected by the CPU 46. Such positional correction of the displacement of the phase shifter 1 can be performed when the phase shifter 1 is replaced, or performed in real time during crystallization processing.

Although the reference linear information 4c may be previously set and stored in the processing circuit 48, the positioning marks 4a and 4b of the processed substrate 4 may be imaged by the CCD camera 24a and 24b and the reference linear information may be formed based on this imaging information like the example of the phase shifter 1. In such a case, a relative position of the phase shifter 1 can be changed with respect to a position of the processed substrate 4 in such a manner that a known relative position from the positioning marks included in the phase shifter 1 is irradiated with a previously arranged arbitrary pattern, thereby applying the arbitrary pattern to the processed substrate 4. It is to be noted that correction of the displacement of the processed substrate 4 in the Z direction can be performed on the earlier stage and/or during processing by the XYZθ drive mechanism 14 in response to a command from the CPU 46 based on positional information from the Z detecting means 22. As a result, a positional control over the processed substrate in a focal depth by application of the laser light having the light intensity distribution with the inverse peak pattern can be facilitated, thereby enabling further assured crystallization.

Positioning of the processed substrate 4 will now be described. The positioning marks 4a and 4b of the processed substrate 4 are imaged by the CCD cameras 24a and 24b, crisscross information of the positioning marks 4a and 4b is compared with previously stored standard initial positional information based on the imaging information in order to calculate a displacement quantity of a component in each of X, Y, Z and θ directions, and the substrate stage 5 is controlled by controlling the XYZθ drive mechanism 14 in such a manner that the displacement quantity in each of these direction becomes zero. After the phase shifter 1 and the processed substrate 4 are positioned in this manner, a crystallization step is automatically executed at a preset position of the processed substrate 4 by using a previously stored program.

In the crystallization step, the processed substrate 4 is intermittently moved in the X direction by using the substrate stage 5, the pulse laser beam is projected from the light source 2a and homogenized by the homogenizer of the illumination system 2, then the laser light is modulated into an irradiation beam with a temperature gradient having an inverse peak pattern form by the phase shifter 1, and the modulated light beam is applied to a preset position of a crystallization area (amorphous silicon thin film 7c) of the processed substrate 4. As a result, a part of the amorphous silicon thin film 7c of the processed substrate 4 irradiated with the light is fused. When the processed substrate 4 is moved and incidence of the pulse laser light is interrupted, the fused part is changed to a temperature reduction state and solidified along the temperature gradient, and an elongated crystal grain grown in the X direction (lateral direction) is formed at the part of the amorphous silicon thin film 7c (actually, many crystal grains aligned in the X direction and the Y direction are formed at the same time by one shot of the pulse laser beam. An area in which the crystal grains are formed at the same time (by one shot of the beam) will be referred to as a crystallization area and described hereinafter. Such an area is a square of, e.g., 2 mm×2 mm). Then, when movement of the processed substrate is stopped, the pulse laser beam is again applied to an area adjacent to the resultant crystallization area of the amorphous silicon thin film 7c, and this part is crystallized. When movement of the processed substrate 4 and application of the pulse laser light are repeated in this manner, all crystallization target areas of the amorphous silicon thin film 7c are crystallized (changed to poly-crystal silicon from amorphous silicon). At this time, intervals of the crystallization areas are controlled in accordance with a movement pitch of the processed substrate, and continuous or discontinuous crystallization areas can be formed. The processed substrate which has a large width (which is large in the Y direction) can be likewise entirely crystallized by sequentially shifting the processed substrate 4 in the Y direction and then performing the same crystallization.

Figure 11:
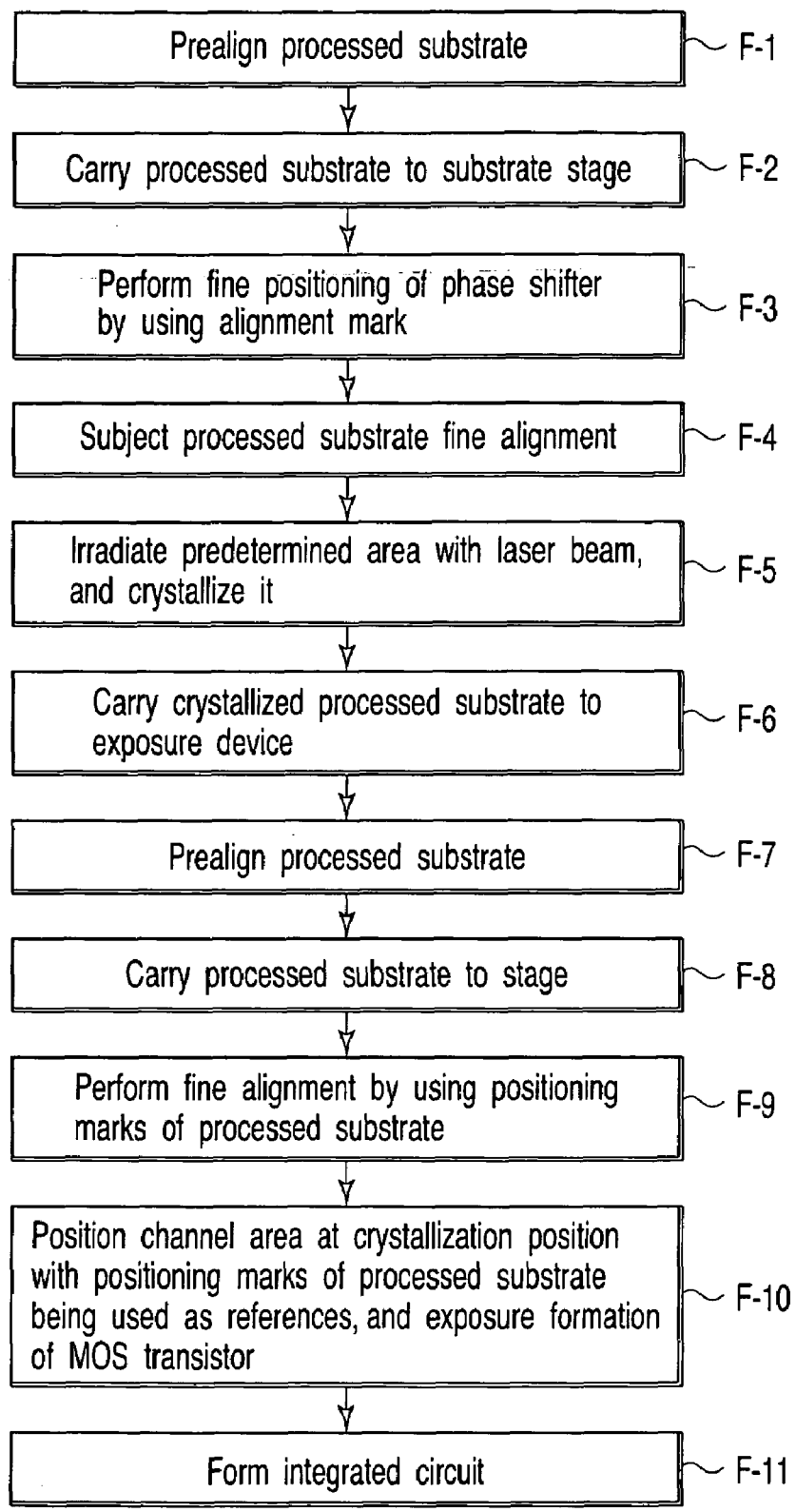
FIG. 11 is a flowchart illustrating an example of an integrated circuit manufacturing method.

A description will now be given as to a concrete example of a method for forming an integrated circuit such as an MOS transistor by using the crystallization apparatus and method with reference to a flowchart of FIG. 11. It is to be noted that, in the following description, like reference numerals denote members which are substantially the same as those described in conjunction with FIGS. 1 to 10, and the detailed explanation thereof will be eliminated. First, such a substrate 4 to be processed (hereinafter referred to as a processed substrate) as shown in FIG. 3 is set in the load lock chamber 30 (FIG. 5) of the projection type crystallization apparatus 6 by a non-illustrated carrier arm. Then, the processed substrate 4 is automatically taken out from the load lock chamber 30 by the carrier robot 28, and carried to/mounted in a predetermined position on the prealignment stage 32. The processed substrate 4 carried to the prealignment stage 32 is prealigned by a known prealignment mechanism which is not shown (F-1).

The prealigned processed substrate 4 is carried to/mounted in a predetermined position of the substrate stage 5 by the carrier robot 28 (F-2). Before and after this step, the phase shifter 1 is subjected to positioning of a component in each of the X, Y and θ directions as mentioned above with the positioning marks 1a and 1b being used as references (F-3). After the step of F-2, the carried processed substrate 4 is subjected to positioning of a component in each of the X, Y, Z and θ directions with the positioning marks 4a and 4b being used as references (F-4). In this manner, the positioning step of the processed substrate 4 is completed.

Figure 12:
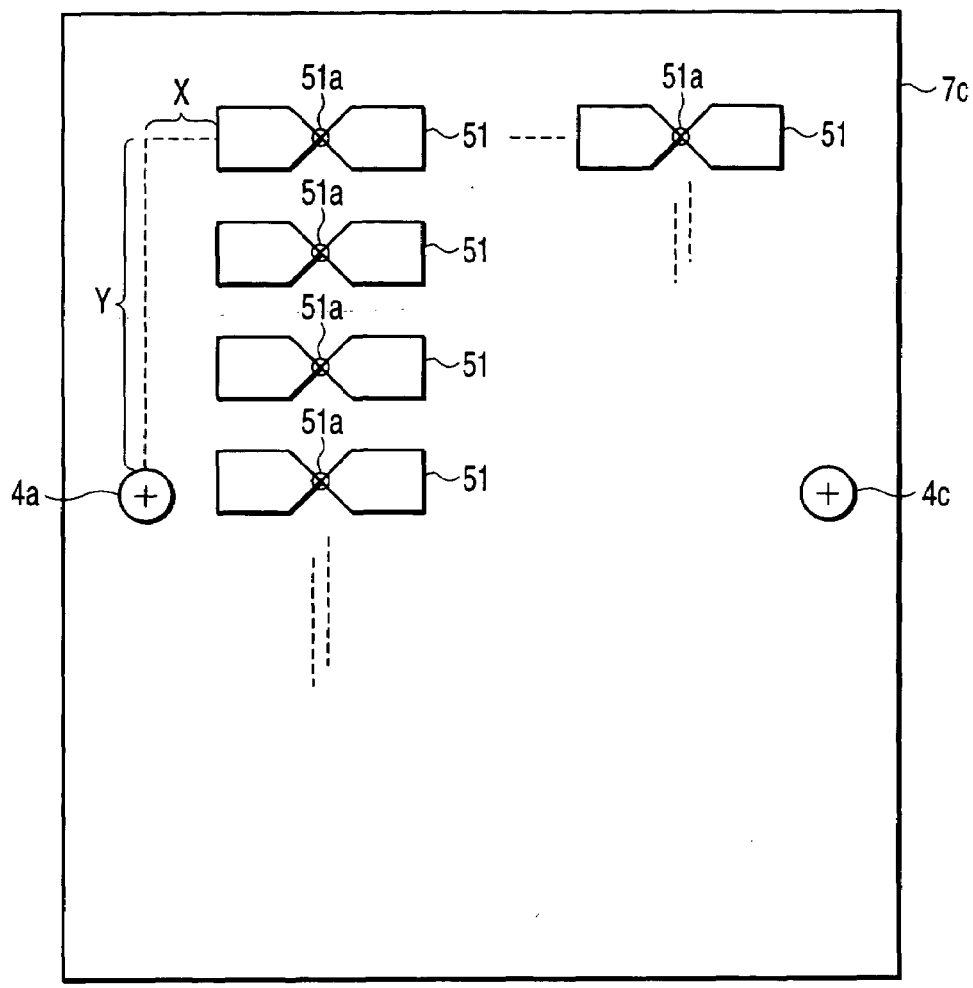
FIG. 12A is a view showing an arrangement pattern of crystallization areas which are crystallized by using an amorphous silicon thin film.
FIG. 12B is a view showing a state in which an MOS transistor is formed in the crystallization area depicted in FIG. 12A.
Figure 12:
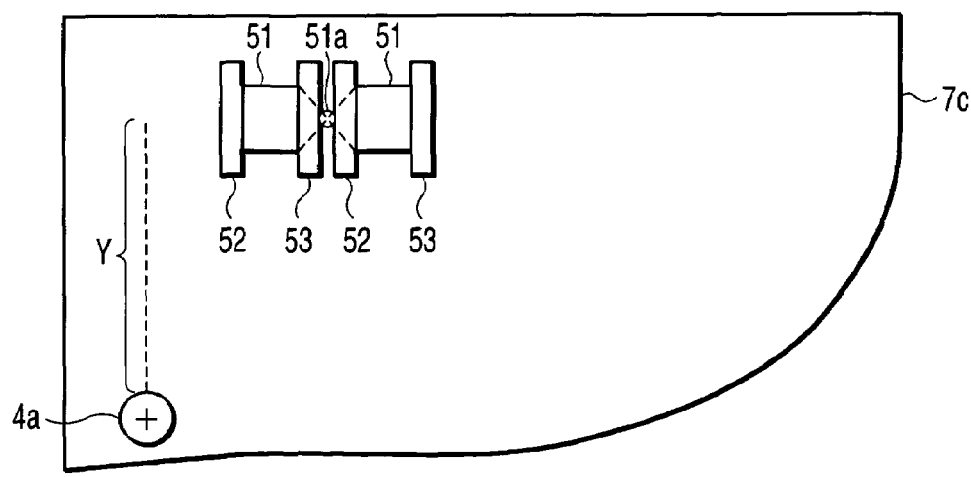

Then, a crystallization step is automatically executed by the projection type crystallization apparatus 6 in a previously stored procedure. Concretely, a previously determined part of the amorphous silicon thin film 7c of the processed substrate 4 is first irradiated with the pulse laser beam projected from the illumination system 2 through the phase shifter 1. The projection of the laser beam and the movement of the processed substrate 4 are sequentially repeated, the previously determined part is crystallized into a pattern of a crystallization area which will be described later with reference to FIG. 12A, thereby terminating the crystallization step (F-5). The processed substrate 4 subjected to the crystallization step is carried to a processing line of, e.g., an integrated circuit by a non-illustrated carrier arm. The processed substrate 4 is carried to the processing line, e.g., an etching processing line, and the cap film 7d on the surface is removed. A pattern in which crystallization areas having many crystallized crystal grains 51 aligned therein are aligned in the X direction and the Y direction is formed on the amorphous silicon thin film 7c from which the cap film 7d is removed, as shown in FIG. 12A. The pattern depicted in FIG. 12A shows that the crystal grains 51 grown in the X direction (lateral direction) with each crystal seed (crystal nucleus) 51a at the center are formed in the X direction and the Y direction with excellent positional accuracy. A predetermined area of an electronic component which is used to obtain previously designed characteristics, e.g., a channel area of an MOS transistor is formed in each or a predetermined one of the crystal grains 51. An area in which the crystal grain 51 is not formed corresponds to amorphous silicon or an area in which small crystal grains are formed. In FIG. 12A, although adjacent crystal grains 51 are separated from each other, they may be connected with each other as described above. The processed substrate 4 which has been through the crystallization step in this manner is carried to an exposure device (F-6).

In the exposure device, the carried processed substrate 4 is prealigned (F-7). The prealigned processed substrate 4 is carried to a previously determined position on the substrate stage of the exposure device (F-8). The processed substrate 4 carried to the substrate stage is subjected to fine alignment by using the positioning marks 4a and 4b provided on this processed substrate 4 (F-9).

The exposure device executes an exposure step of a mask to which a corresponding integrated circuit pattern of the fine-aligned processed substrate is formed. The mask is programmed to be positioned with respect to the processed substrate 4 in such a manner that, e.g., a channel area of each MOS transistor of an integrated circuit is positioned in each of the crystal grains 51. The exposure step is executed with respect to the processed substrate 4 positioned in this manner (F-10). This step is repeated by using different masks, a known integrated circuit manufacturing process, e.g., an exposure process such as a CVD step, an etching step and/or an impurity implantation step of forming source and drain areas 52 and 53 is performed, and a source area 52 and a drain area 53 are formed in such a manner that the channel area between these areas is positioned in the crystal grain 51 as shown in FIG. 12B, thereby forming an integrated circuit such as an MOS transistor (F-11).

Since the detailed manufacturing steps of the MOS transistor are well know, the detailed explanation thereof is eliminated, but these steps can be achieved in the following manner, for example.

The crystallization step is terminated, and a gate insulating film, e.g., a silicon oxide thin film is formed on a surface of each crystal grain 51 in the crystallization area of the processed substrate 4 in which the amorphous silicon thin film 7c is exposed. An electroconductive film forming a gate electrode, e.g., a W—Mo film is laminated on this silicon oxide thin film. Then, a gate electrode is formed by selectively etching the electroconductive film with the gate electrode pattern being used as a mask. Subsequently, impurities which are used to form source and drain areas with the gate electrode being utilized as a mask are ion-implanted in the crystallization area, thereby forming the source and drain areas 52 and 53.

In the above embodiment, although the description has been given as to the example in which the two crisscross marks are provided on the both right and left end sides of the rectangular phase shifter 1 as the positioning marks 1a and 1b of the phase shifter 1, the present invention is not restricted thereto, and any conformation can be used as long as they are the positioning marks with which information which can be compared with the reference linear information 4c in the XYθ direction can be obtained as shown in FIG. 9. For example, one positioning mark 1a may be a linear mark extending in the X direction, and the other positioning mark 1b may be a linear mark extending in the Y direction. Furthermore, the number of positioning marks is not restricted to two, and one or more positioning marks can be adopted depending on a shape thereof. Moreover, a part or parts of the phase shifter 1, e.g., an edge or edges may be used as a positioning mark or marks without specially providing the positioning marks. These structures can be likewise applied to the positioning marks 4a and 4b of the processed substrate 4.

In the above embodiment, although the CCD cameras 10a, 10b; 24a, 24b are used as detection devices which read the positioning marks 1a, 1b; 4a, 4b, the present invention is not restricted thereto, and any other optical detecting means or detecting means based on other principles may be adopted. For example, when a triangular notch is formed to an optical modulation element such as the phase shifter as a positioning mark, it is possible to use a photocoupler which detects a change in a quantity of light which passes through this notch and converts it into positional information. Additionally, when an ultrasonic reflection surface is formed to the phase shifter as a positioning mark, an ultrasonic sensor may be used.

When a positional accuracy with which a position in a surface vertical to an optical axis of the phase shifter 1 is detected is 0.5 μm, using an optical system of ⅕-power as the image forming optical system 3 sets a position of the phase shifter 1 with respect to the processed substrate 4 with a position accuracy in a reference substrate surface of 0.1 μm.

In the foregoing embodiment, although the phase shifter 1 having the linear phase shift portions which modulates the incident laser beam into the laser beam having the light intensity distribution with the inverse peak patterns is used as the optical modulation element, the phase shifter 1 is not necessarily restricted to one which modulates the incident laser beam into such a conformation. For example, a phase shifter having a point type phase shift portion may be used. Further, the optical modulation element is not restricted to the phase shifter 1, and any kind of optical modulation element can be used as long as it can modulate the incident light beam into light beam having a predetermined light intensity distribution. For example, even if a mask having areas with different transmittances is used, the light beam which passes through this mask can be modulated into a light beam having an arbitrary light intensity distribution by appropriately selecting transmittances and areas.

In the foregoing embodiment, the description has been given as to crystallization by the phase shifter 1 to which a predetermined phase shift pattern is formed. The position adjustment mechanism is provided in the foregoing embodiment as shown in FIG. 5. Therefore, as the phase shifter 1, one phase shifter to which a plurality of types of phase shift patterns are formed may be used, and the phase shift patterns may be appropriately selected. This example will now be described hereinafter.

A first conformation of a phase shift pattern formed to the phase shifter 1 is a pattern B shown in FIG. 13. In the following description, like reference numerals denote parts equal to those shown in FIGS. 1 to 5, and the detailed explanation thereof will be eliminated. The phase shift pattern B shown in FIG. 13A is a line type phase shift pattern in which rectangular areas 1A having a phase value of, e.g., 0 degrees and rectangular areas 1B having a phase value of 180 degrees are alternately repeated along one direction. A phase difference line (boundary of phases: phase shift line) 1C of 180 degrees is formed between the two rectangular areas 1A and 1B. Furthermore, in the entire phase shift pattern, one or more phase difference lines 1C are formed at a predetermined pitch. When such a phase shifter 1 is used, a light intensity distribution with an inverse peak shape in which a peak at which a light intensity is substantially zero or minimum is provided at a line area corresponding to the phase difference line 1C of the phase shift pattern and the light intensity is suddenly increased toward the periphery (in the lateral direction) as shown in FIG. 13B is formed on the surface of the processed substrate 4. In regard to a step which is required to form the phase shift pattern with a desired phase difference, assuming that λ is a wavelength of laser light and n is a refractive index of a transparent substrate, a film thickness t of a transparent substrate can be calculated based on $t=\lambda/2(n-1)$. In order to provide a phase difference of 180° with a refractive index of a quartz substrate being 1.46 and a wavelength of XeCl excimer laser light being 308 nm, a step of 334.8 nm can be formed by a method such as etching.

A second conformation of the phase shift pattern is a pattern C shown in FIG. 14. This pattern C takes a conformation in which four types of rectangular areas 10A, 10B, 10C and 10D having different phase values are adjacent to each other at a predetermined point 10E as shown in FIG. 14. This pattern has, e.g., a first rectangular area 10A having a phase value of 0 degrees, a second rectangular area 10B having a phase value of 90 degrees, a third rectangular area 10C having a phase value of 180 degrees, and a fourth rectangular area 10D having a phase value of 270 degrees. Further, four straight lines which intersect crosswise at the point 10E are a boundary between the first rectangular area 10A and the second rectangular area 10B, a boundary between the second rectangular area 10B and the third rectangular area 10C, a boundary between the third rectangular area 10C and the fourth rectangular area 10D, and a boundary between the fourth rectangular area 10D and the first rectangular area 10A. A practical pattern has a conformation that many units comprising four rectangular areas like the above example are aligned and many crystal grains can be simultaneously formed.

Figure 16A:
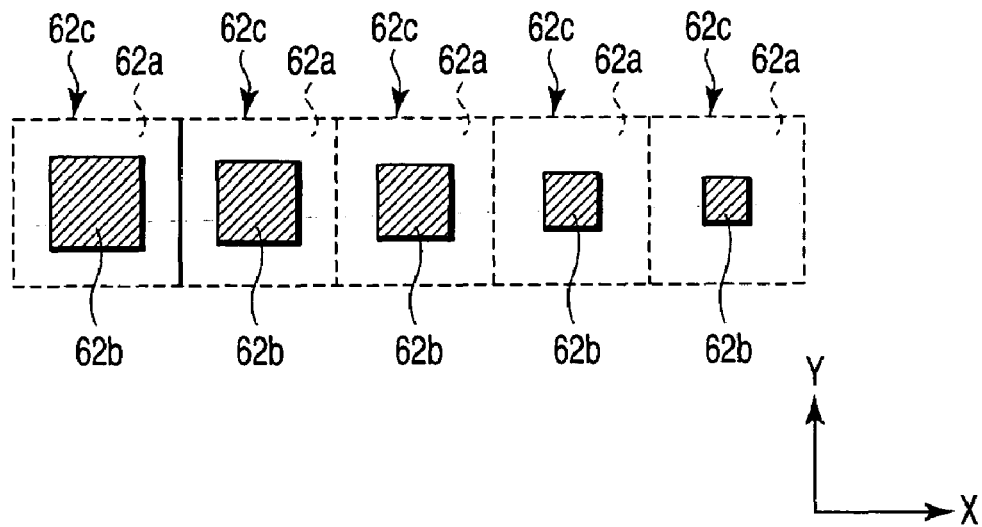
FIG. 16A is a view showing a part of the phase shift pattern depicted in FIG. 15A in a state that a first area and a second area are formed in each cell.

A third conformation of the phase shift pattern is a pattern D shown in FIGS. 15A and 16A. In the pattern D shown in FIG. 15A, many first areas 62b having a first phase value are distributed in a dot-like form in a second area 62a having a second phase value on a transparent substrate, e.g., a quartz glass substrate 62 in order to obtain such a desired inverse peak pattern as shown in FIG. 15B. These first areas 62b are set in such a manner that their area share ratio becomes smaller toward sides from a central portion in the X direction. A minimum light intensity peak is formed by the central portion at which the area share ratio of the first areas 62b is large.

FIG. 16A is a view showing a basic pattern in the phase shift pattern depicted in FIG. 15A. Referring to FIG. 16A, the basic pattern of the phase shift pattern has a plurality of cells (indicated by broken lines forming rectangles in the drawing) whose size is optically smaller than a radius of a point spread distribution range of the image forming optical system 3.

In each cell 62c are formed a first area (indicated by a hatched portion in the drawing) 62b having a phase value (first phase value) of, e.g., −90 degrees and a second area (indicated by a blank portion in the drawing) having a phase value (second phase value) of, e.g., 0 degrees. As shown in FIG. 16A, area share ratios of the first area 62b and the second area 62b in each cell 62c vary in accordance with each cell.

In other words, this pattern has a phase distribution in which area share ratios of the first area 62b having the phase value of −90 degrees and the second area 62a having the phase value of 0 degrees vary depending on each position in the X direction. More specifically, an area share ratio of the second area 62a in each cell is closest to 50% in the cell on the left-hand size in the drawing while it is closest to 100% in the cell on the right-hand side in the drawing, and it monotonously varies between these cells along the X direction.

As described above, the phase shifter 1 has a phase distribution based on a phase modulation unit (cell) 62c whose size is optically smaller than a radius of the point spread distribution range of the image forming optical system 4. Therefore, a light intensity distribution formed on the processed substrate 4 can be freely controlled in accordance with an analytical and simple calculation by appropriately changing the area share ratios of the first area 62b and the second area 62a in each phase modulation unit 62c, i.e., a sum of two phase vectors.

Figure 16B:
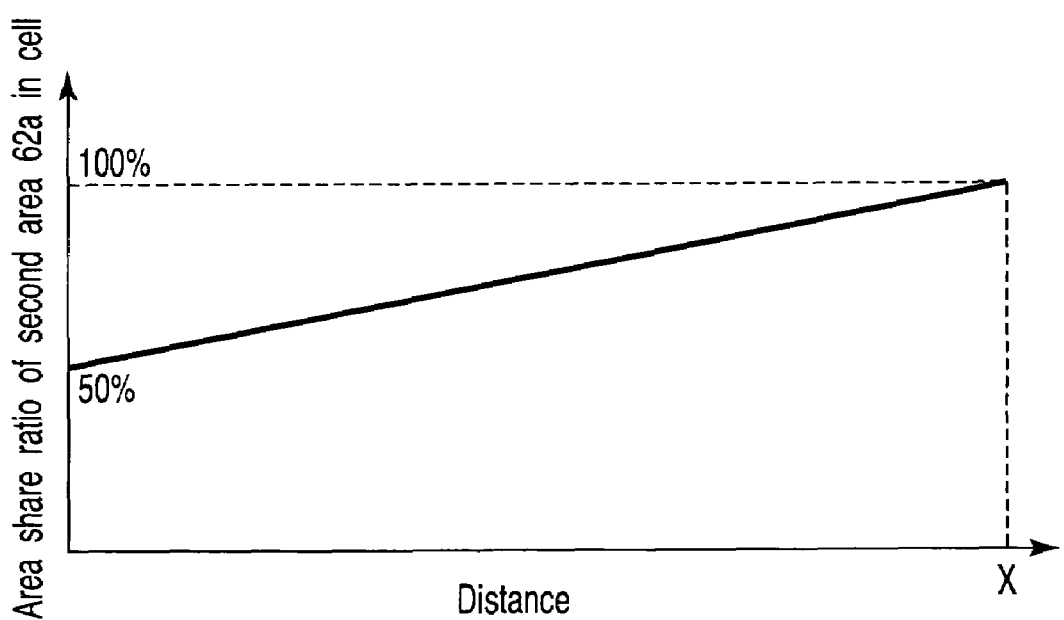
FIG. 16B is a diagrammatic view showing an occupied superficial measure of the second area in each cell depicted in FIG. 16A.

Concretely, as shown in FIG. 16B, it is possible to obtain a one-dimensional (having a gradient in the X direction) V-shaped light intensity gradient distribution in which the light intensity is maximum at positions of both sides where the area share ratio of the second area 62a is closest to 100% and the light intensity is minimum at a central position where the area share ratio of the second area 62a is closest to 50%. In this manner, a light beam dividing direction (Y direction) of a birefringent element is orthogonal to a gradient direction (X direction) of the light intensity gradient distribution. The phase shifter 1 can be manufactured by forming a thickness distribution corresponding to a necessary phase difference on, e.g., a quartz glass substrate. A change in thickness of the quartz glass substrate can be formed by selective etching or focused ion beam (FIB) processing.

Figure 17:
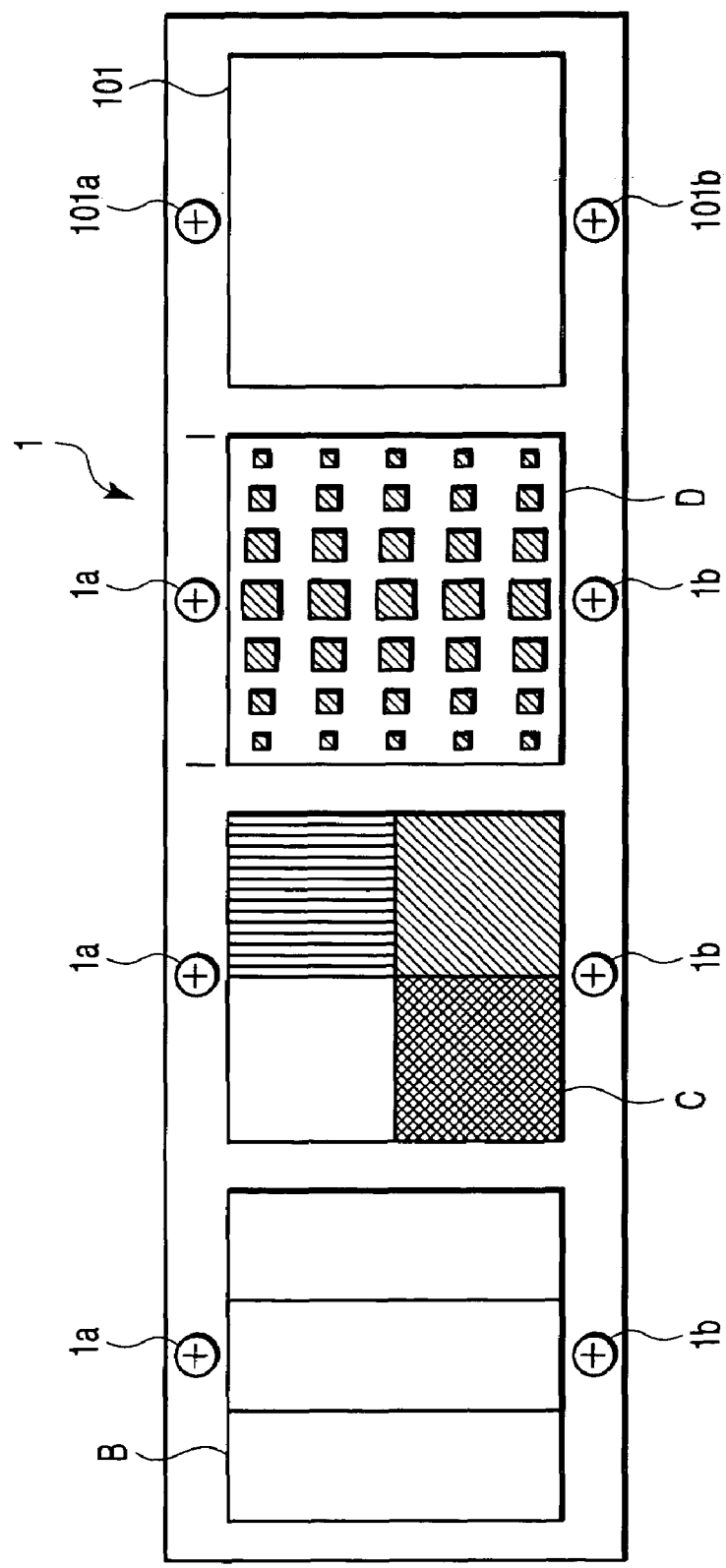
FIG. 17 is a view schematically showing a phase shifter including the phase shift pattern depicted in FIGS. 13A, 14 and 15A.
Figure 18:
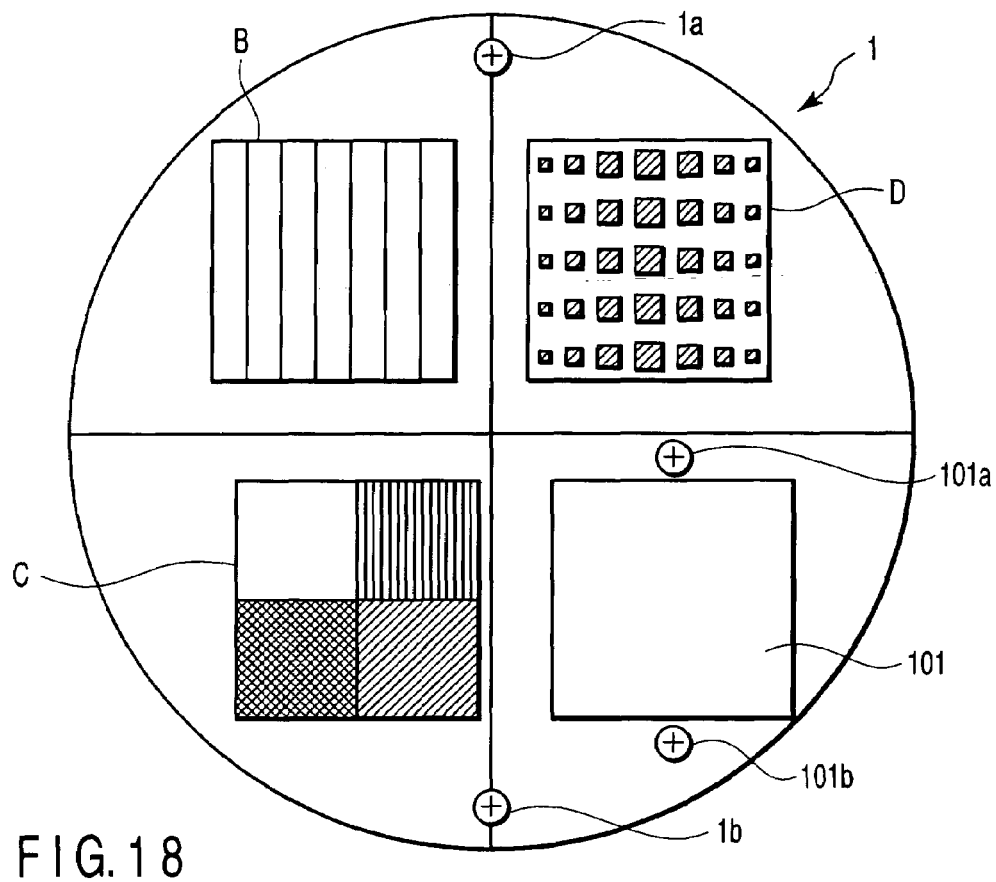
FIG. 18 is a view schematically showing another phase shifter including the phase shift pattern depicted in FIGS. 13A, 14 and 15A.

FIGS. 17 and 18 show embodiments of the phase shifter 1 having the phase shift patterns B, C and D respectively depicted in FIGS. 13A, 14 and 15A. Each of the phase shifters 1 respectively shown in FIGS. 17 and 18 has a plurality of types of, for example three types of phase shift patterns B, C and D formed on one substrate, and it is used as a phase shifter of the crystallization apparatus 6 depicted in FIG. 5 so that a desired phase shift pattern can be selected. To such a phase shifter 1 are formed an alignment mark forming pattern 101 and positioning marks 101a and 101b of the alignment mark forming pattern 101 which are described below. Although the phase shifter 1 shown in FIG. 17 has a pair of positioning marks 101a, 101b positioned to correspond to each of the phase shift patterns B, C, D, only one pair of positioning marks 101a, 101b may be applied to any one of phase shift patterns.

Figure 19:
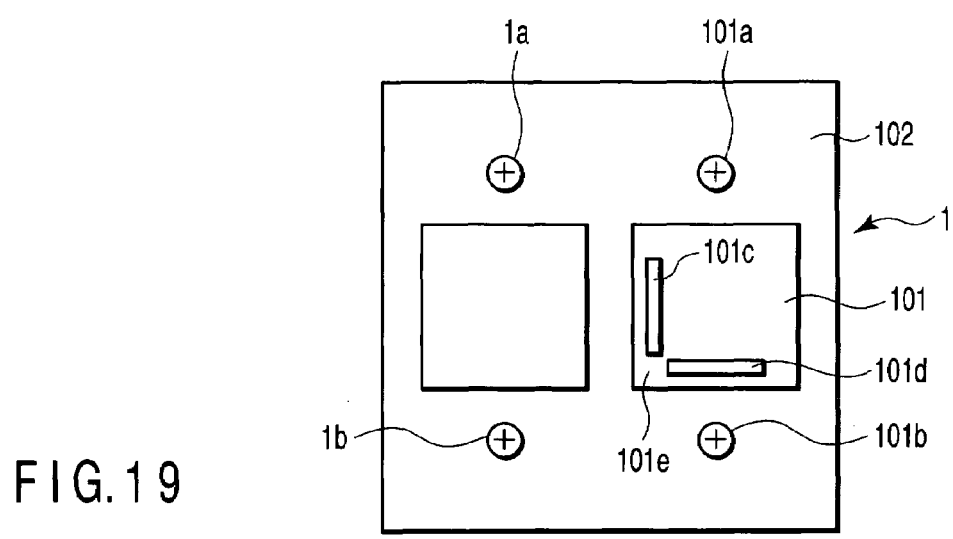
FIG. 19 is a plane view showing a concrete example of a phase shifter used in an electronic device manufacturing method according to the present invention.
Figure 20:
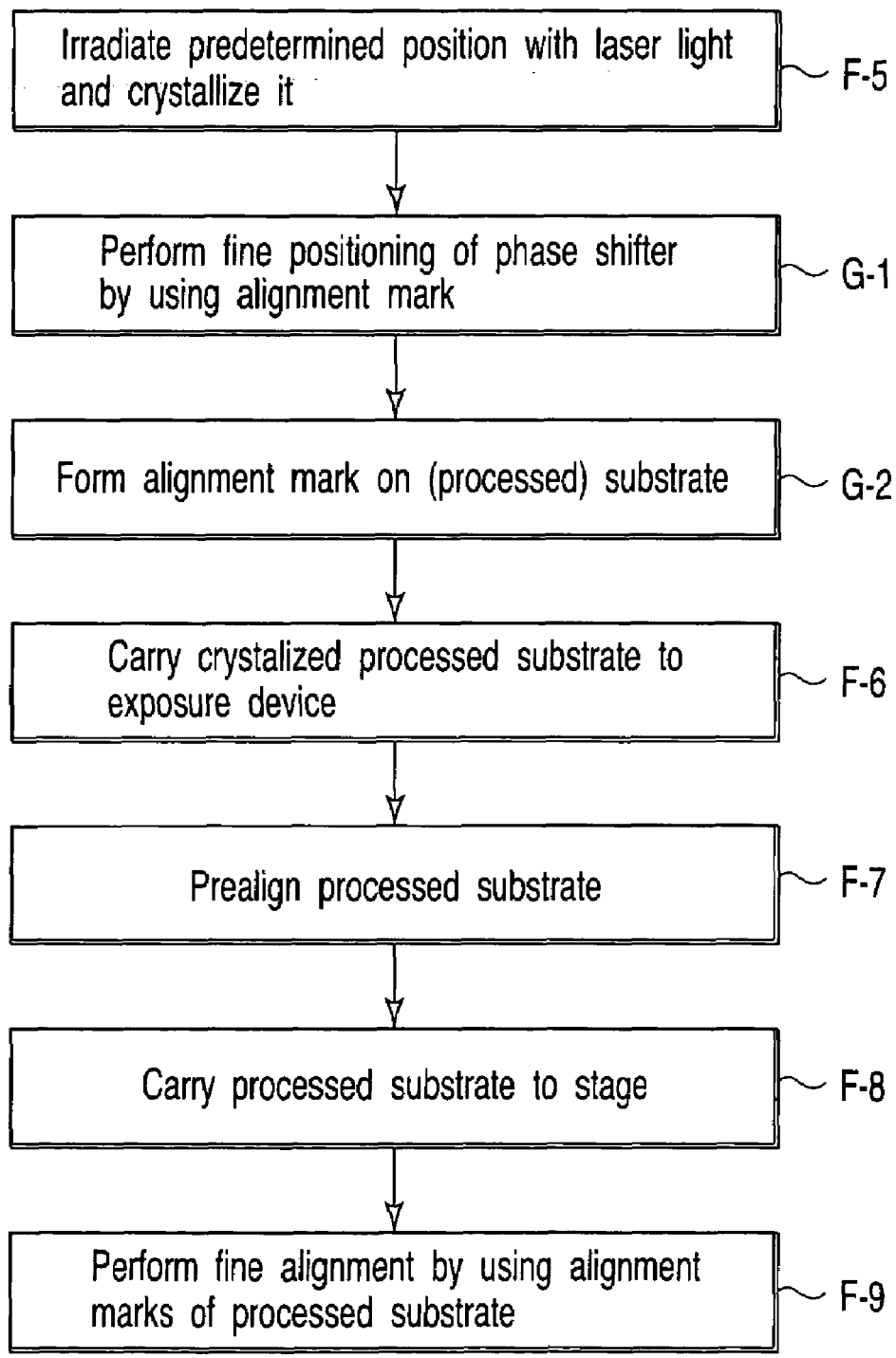
FIG. 20 is a block diagram illustrating an example of the electronic device manufacturing method when the phase shifter illustrated in FIG. 19 is used.
Figure 21A:
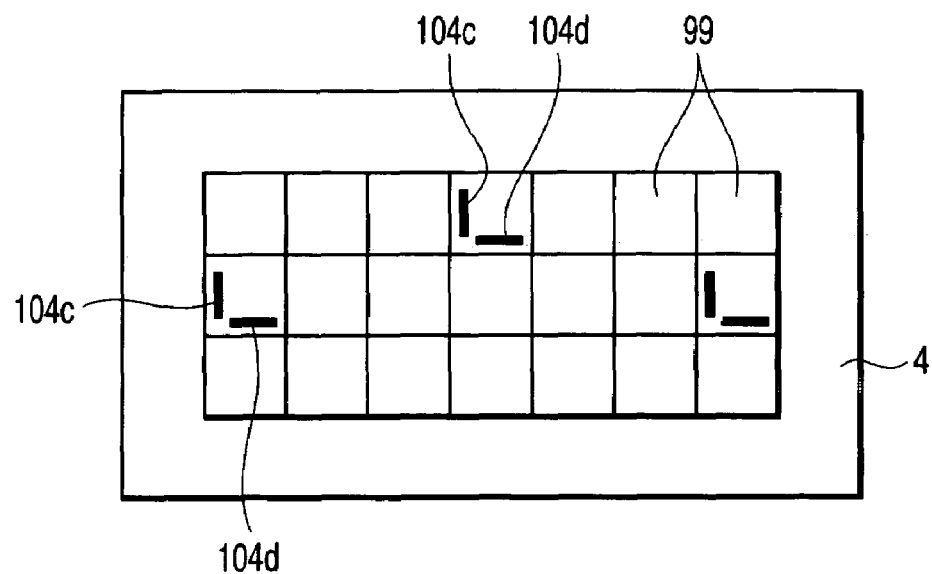
FIG. 21A and FIG. 21B are plane views showing different examples of the processed substrate to which alignment marks formed by using the phase shifter depicted in FIG. 19 is provided.
Figure 21B:
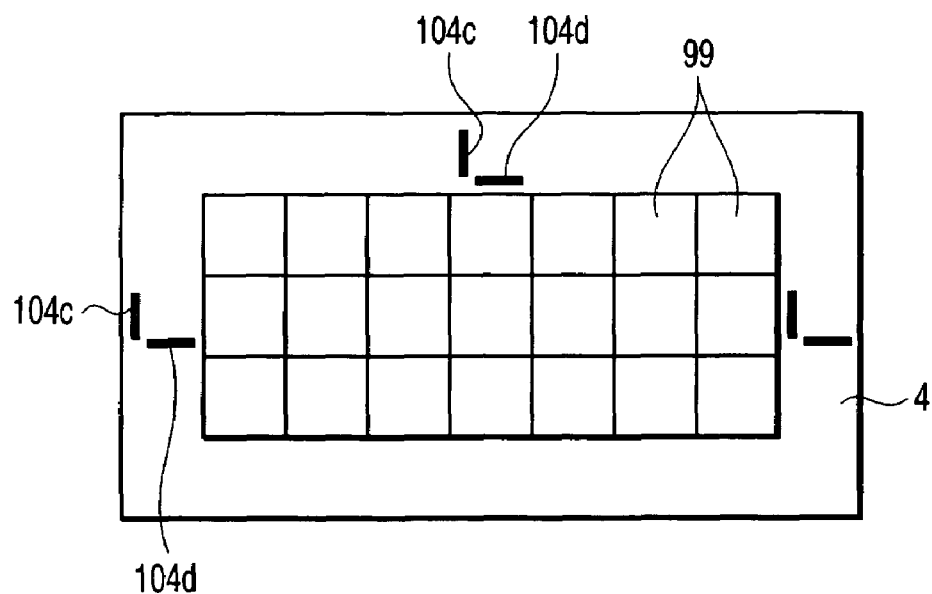

Another example in which the above phase shift patterns B, C and D as well as the alignment mark forming pattern 101 are formed to the phase shifter 1 will now be described with reference to FIG. 19. This phase shifter 1 has a transparent substrate 102 on which phase shift patterns B, C and D and the alignment mark forming pattern 101 are equal in size and adjacently aligned. Positioning marks 101a and 101b of the alignment mark forming pattern 101 are formed to this transparent substrate 102. These marks 101a and 101b may be substantially the same as the positioning marks 1a and 1b of the phase shifter (in detail, this is a phase shift pattern), and these marks 1a, 1b; 101a, 101b can be, therefore, formed on the transparent substrate 102 at the same step. The alignment mark forming pattern 101 can take various conformations, but it is formed of a pair of transparent rectangular slits 101c and 101d respectively extending in the X direction and the Y direction and an opaque area 101e around these slits 101c and 101d. An example of a manufacturing method of an electronic device using such a phase shifter 1 will now be described hereinafter with reference to FIGS. 20 and 21.

This method is substantially the same as the manufacturing method described with reference to FIG. 11 except the method for forming the alignment marks, and hence this method alone will be explained. The projection type crystallization apparatus 6 applies a laser beam to a predetermined position by using the phase shift pattern of the phase shifter 1 shown in FIG. 19 so that many crystallization areas are formed on the processed substrate 4 as shown in FIG. 21 (F-5). It is to be noted that they are denoted by reference numerals in FIG. 21. Incidentally, although the crystallization areas 99 are very large with respect to the processed substrate 4 in FIG. 21, this facilitates viewing the figure. Practically, in cases where a rectangular liquid crystal display glass substrate of, e.g., 730 mm×920 mm is used as the processed substrate 4, if the crystallization areas 99 each having a size of 2 mm×2 mm are formed on the entire processed substrate, 167900 crystallization areas can be formed (in practice, since the crystallization areas are not formed in an outer peripheral portion of the processed substrate, the number of the crystallization areas is smaller than this value).

Thereafter, the phase shifter 1 is moved in the X direction by the XYθ drive mechanism 40 (FIG. 7), and the alignment mark forming pattern 101 is placed at a position where the phase shift pattern was positioned. Then, this pattern 101 is positioned with respect to the processed substrate 4 by using the positioning marks 101a and 101b (G-1). The positioning at this moment can be carried out in substantially the same manner as the positioning of the phase shifter (in detail, this is the phase shift pattern) described above in detail. Then, the laser beam is projected from the light source to the phase shifter 1. This laser beam passes through the alignment marks 101c and 101d of the alignment mark forming pattern 101, and strikes on a predetermined area of the processed substrate 4. As a result, this laser beam incident portion of the processed substrate is subjected to heat treatment, and a pair of alignment marks 104c and 104d are formed on the processed substrate 4 as shown in FIG. 21. This heat treatment is processing by which a material of the processed substrate is deformed or transformed and becomes physically different from other areas so that the area subjected to heat treatment can be differentiated from other areas.

Then, the processed substrate 4 is shifted by one pitch, the same processing is carried out, and a plurality of pairs of alignment marks 104c and 104d are formed in a plurality of predetermined areas on the processed substrate 4. In this example, although three pairs of alignment marks 104c and 104d are formed on one processed substrate 4, the present invention is not restricted to this number. Further, positions at which the alignment marks 104c and 104d are formed is arbitrary. As one example, these marks are formed in a crystallization area forming range in FIG. 21A, and they are formed outside the crystallization area forming range in FIG. 21B.

As described above, the processed substrate 4 to which the alignment marks 104a and 104d are formed is subjected to fine alignment by using the alignment marks 104c and 104d at a step F-9 after steps F-7 and F-8.

Although the alignment marks are formed on the processed substrate after crystallization in the manufacturing method according to the foregoing embodiment, the order may be reversed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A crystallization method comprising:
   sequentially projecting a pulse laser beam toward a processed substrate;
   light-intensity-modulating the laser beam into a laser beam having a light intensity distribution with a predetermined pattern, illuminating an area of the processed substrate, and crystallizing the area;
   detecting a position of the optical modulation element before and/or during the light-intensity-modulation; and
   controlling the position of the optical modulation element based on a detection result of detection of the third step.

2. The crystallization method according to claim 1, wherein the optical modulation element is a phase shifter having at least one linear or dot-like phase shift portion in such a manner that the incident laser beam is light-intensity-modulated into the laser beam having a light intensity distribution with at least one inverse peak pattern which has a minimal light intensity peak and the processed substrate is illuminated with the modulated laser beam.

3. A crystallization apparatus comprising:
   an illumination system which projects a light beam with which a processed substrate is illuminated;
   an optical modulation element which is placed on an optical axis of the light beam from the illumination system, and light-intensity-modulates the light beam projected by the illumination system into a light beam having a light intensity distribution with an inverse peak pattern;
   a supporting member for supporting the processed substrate in such a manner that the light-intensity-modulated light beam strikes onto the processed substrate;
   a first position detecting assembly for detecting an absolute position of the optical modulation element;
   a second position detecting assembly for detecting an absolute position of the processed substrate; and
   a position controlling assembly for controlling a position of at least one of the optical modulation element and the processed substrate based on detection results of the first and second position detecting assemblies.

4. The crystallization apparatus according to claim 3, wherein the illumination system has a laser light source which projects a laser beam as said light beam and an optical unit for homogenizing a light intensity distribution of the laser beam projected from the laser light source and causing the laser beam to enter the optical modulation element, and the optical modulation element has an optical modulation pattern which modulates the incident laser beam into a laser beam having a light intensity distribution with at least one inverse peak pattern which has a minimal intensity peak.

5. The crystallization apparatus according to claim 3, wherein the first position detecting assembly detects a position of the optical modulation element in at least one of an X direction and a Y direction which are orthogonal to the optical axis and orthogonal to each other and a θ direction with the optical axis at the center and, when the detected position deviates from a previously stored standard position, the position controlling assembly moves the optical modulation element in order to correct the displacement of the detected position.

6. The crystallization apparatus according to claim 3, wherein the first position detecting assembly detects a position of the optical modulation element in the X direction and the Y direction which are orthogonal to the optical axis and orthogonal to each other and the θ direction with the optical axis at the center and, when the detected position deviates from a previously stored standard position, the position controlling assembly moves the optical modulation element in order to correct the displacement.

7. The crystallization apparatus according to claim 3, wherein the first position detecting assembly has at least one positioning mark provided to the optical modulation element and a positioning mark detection device which detects the positioning mark and outputs positional information, and the position controlling assembly compares the positional information with reference positional information, and moves the optical modulation element in order to correct a displacement if there is a difference between the both sets of positional information.

8. The crystallization apparatus according to claim 7, wherein said at least one positioning mark includes a pair of positioning marks arranged to the optical modulation element in such a manner that they are distanced from each other, the positioning mark detection device has a pair of detection units which independently detect the positioning marks, and the position controlling assembly has a unit for creating linear positional information based on detection information of the pair of detection units, comparing it with reference linear position information and outputting information of a displacement of the optical modulation element in the XYθ direction, and a drive mechanism which moves the optical modulation element in the XYθ direction based on the information from this means.

9. The crystallization apparatus according to claim 8, wherein said position controlling assembly includes a support mechanism which replaceably supports the optical modulation element, and moves the optical modulation element in the XYθ direction by using the drive mechanism.

10. The crystallization apparatus according to claim 8, wherein the pair of positioning marks have crisscross marks provided in the vicinity of both ends of the optical modulation element, and the pair of detection units have a pair of CCD cameras which independently image the crisscross marks.

11. The crystallization apparatus according to claim 7, wherein the reference positional information is preset.

12. The crystallization apparatus according to claim 7, further comprising an assembly for detecting a position of the processed substrate supported by the supporting member and creating the reference positional information based on the detection result.

13. An optical modulation element having a phase shift pattern, an alignment mark pattern, and positioning marks which are used to position these patterns with respect to the processed substrate.

14. An optical modulation element having a phase shifter portion having at least one linear or a dot shaped phase shift portion which forms the minimal intensity peak to incident laser beam, and at least one positioning mark which is used for positioning of the phase shifter portion.

* * * * *